(12) United States Patent
Huang

(10) Patent No.: US 10,418,482 B2
(45) Date of Patent: Sep. 17, 2019

(54) HIGH VOLTAGE DEVICE AND MANUFACTURING METHOD THEREOF

(71) Applicant: RICHTEK TECHNOLOGY CORPORATION, Zhubei, Hsinchu (TW)

(72) Inventor: Tsung-Yi Huang, Hsinchu (TW)

(73) Assignee: RICHTEK TECHNOLOGY CORPORATION, Zhubei, Hsinchu (TW)

( * ) Notice: Subject to any disclaimer, the term of this patent is extended or adjusted under 35 U.S.C. 154(b) by 0 days.

(21) Appl. No.: 16/057,725

(22) Filed: Aug. 7, 2018

(65) Prior Publication Data
US 2019/0067471 A1    Feb. 28, 2019

(30) Foreign Application Priority Data

Aug. 30, 2017  (TW) .............................. 106129596 A

(51) Int. Cl.
| H01L 29/78 | (2006.01) |
| H01L 21/266 | (2006.01) |
| H01L 29/10 | (2006.01) |
| H01L 21/265 | (2006.01) |
| H01L 29/06 | (2006.01) |
| H01L 29/08 | (2006.01) |
| H01L 29/36 | (2006.01) |
| H01L 29/66 | (2006.01) |

(52) U.S. Cl.
CPC ........ *H01L 29/7816* (2013.01); *H01L 21/266* (2013.01); *H01L 21/26513* (2013.01); *H01L 29/0642* (2013.01); *H01L 29/0649* (2013.01); *H01L 29/0865* (2013.01); *H01L 29/0882* (2013.01); *H01L 29/1095* (2013.01); *H01L 29/36* (2013.01); *H01L 29/66681* (2013.01); *H01L 29/08* (2013.01); *H01L 29/66* (2013.01)

(58) Field of Classification Search
CPC ............. H01L 29/7876; H01L 29/1095; H01L 29/0649; H01L 29/86; H01L 21/286
USPC ........ 257/343, 334, 337; 438/286, 234, 294, 438/258
See application file for complete search history.

(56) References Cited

U.S. PATENT DOCUMENTS

2013/0344671 A1 * 12/2013 Kim ...................... H01L 29/286
                                                    438/286

* cited by examiner

*Primary Examiner* — Thinh T Nguyen
(74) *Attorney, Agent, or Firm* — Tung & Associates

(57) ABSTRACT

A high voltage device is formed in a semiconductor substrate, and includes: a first deep well, a lateral lightly doped region, a high voltage well, an isolation region, a body region, a gate, a source, a drain, and a first isolation well. The first deep well and the first isolation well are for electrical isolating the high voltage device from neighboring devices below a top surface of the semiconductor substrate. The lateral lightly doped region is located between the first deep well and the high voltage well in a vertical direction, and the lateral lightly doped region contacts the first deep well and the high voltage well. The lateral lightly doped region is for reducing an inner capacitance of the high voltage device when the high voltage device operates, to improve transient response.

36 Claims, 15 Drawing Sheets

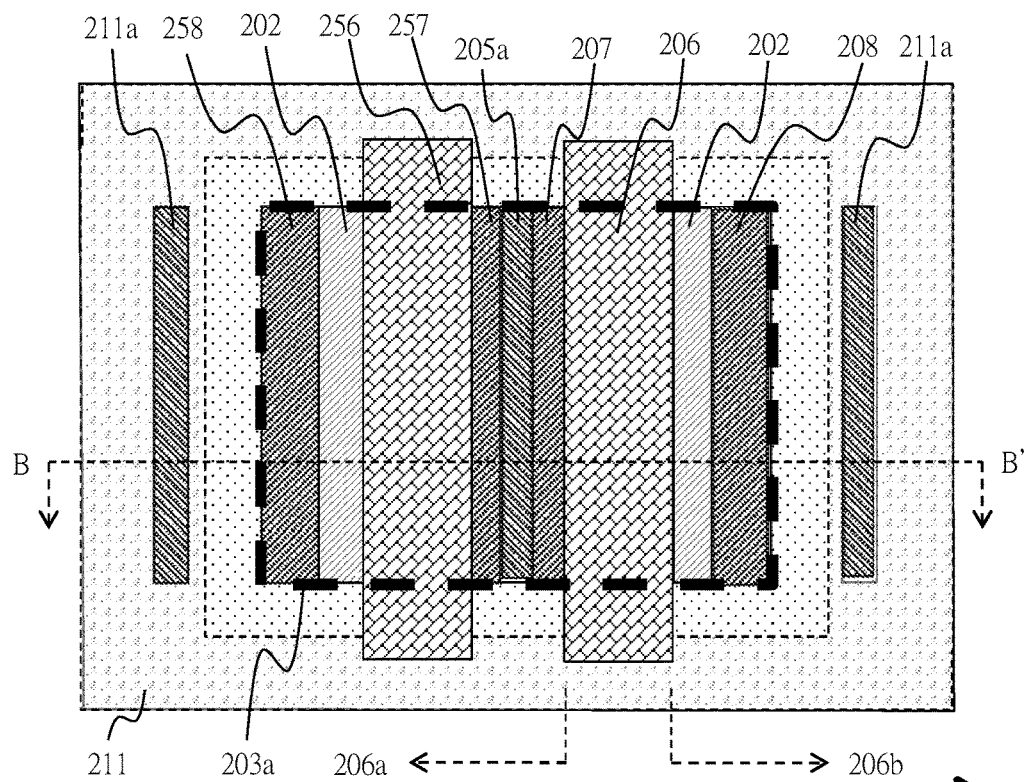
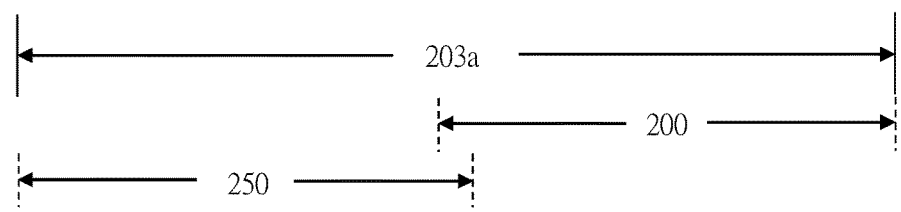
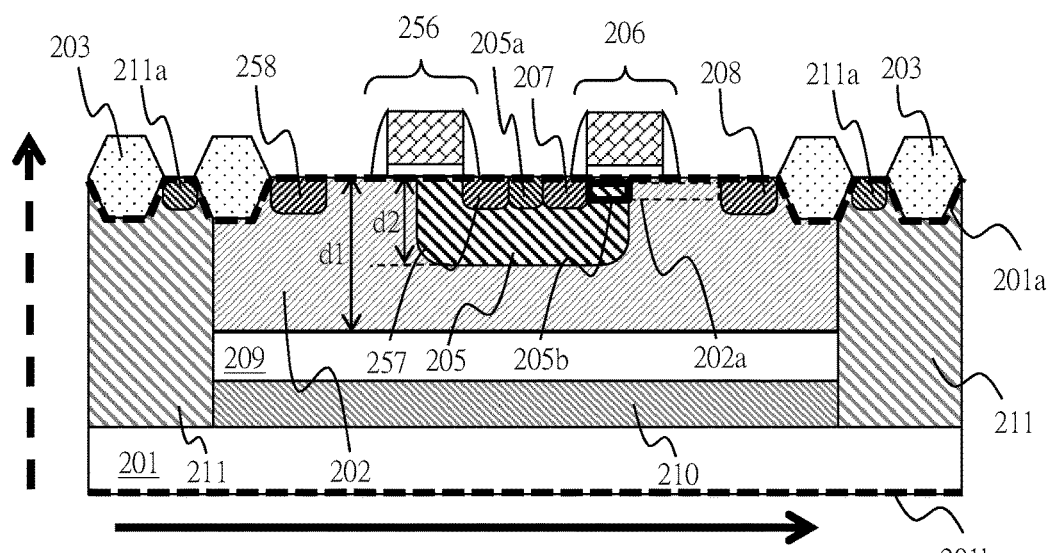
Fig. 2A
Fig. 2B

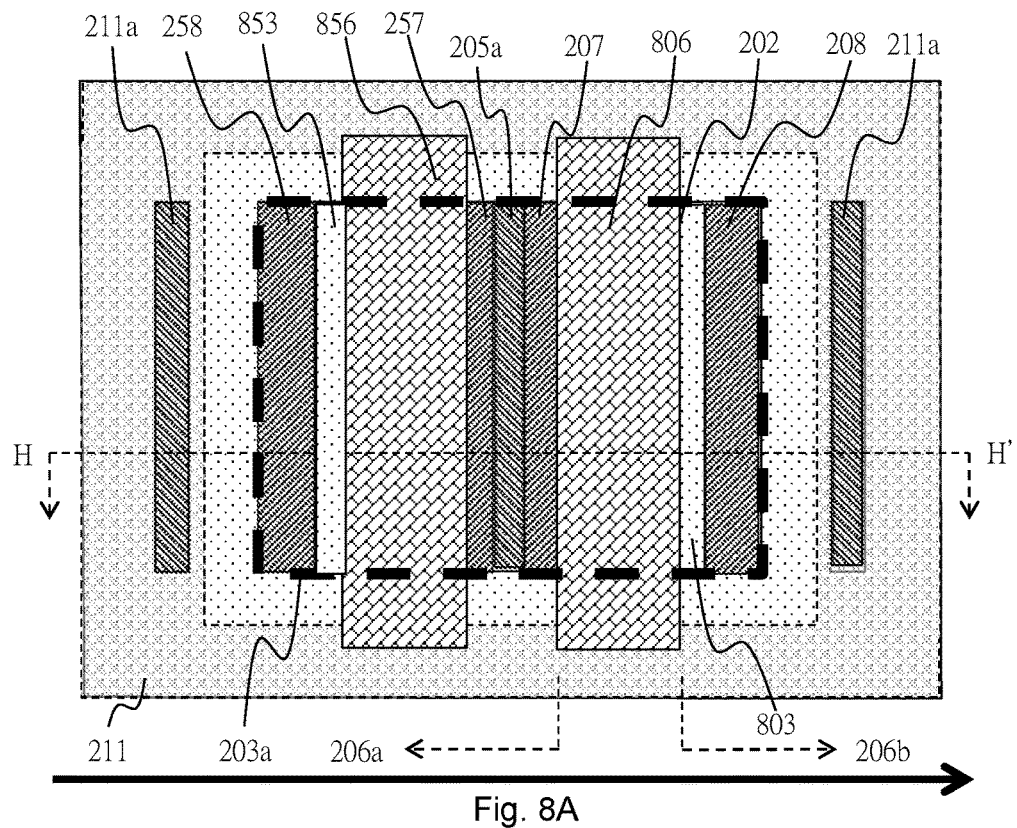
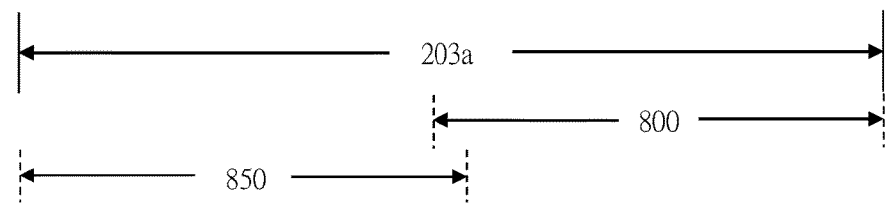
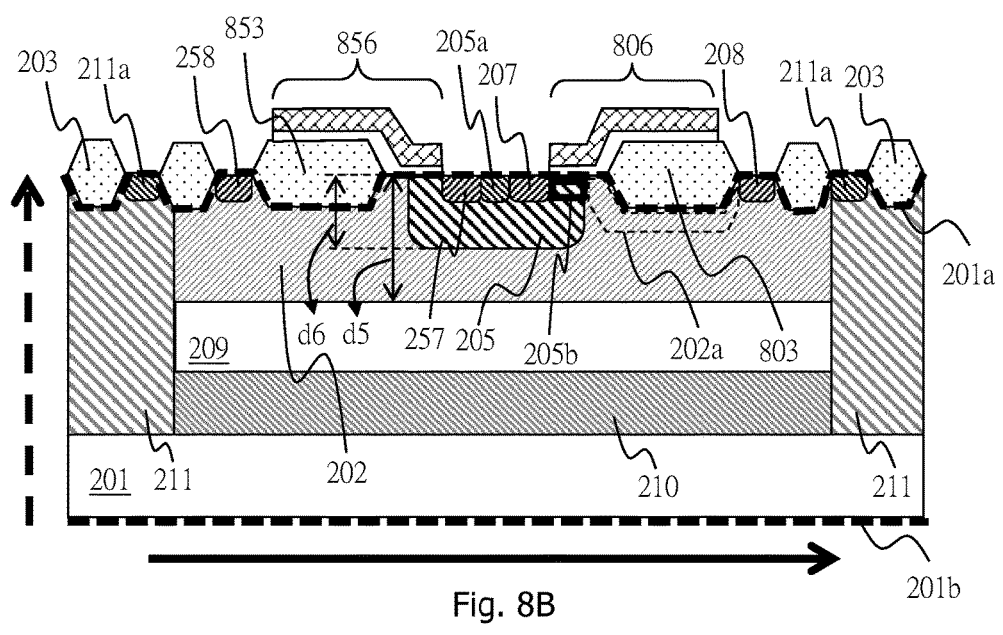
Fig. 8A
Fig. 8B

HIGH VOLTAGE DEVICE AND MANUFACTURING METHOD THEREOF

CROSS REFERENCE

The present invention claims priority to TW 106129596, filed on Aug. 30, 2017.

BACKGROUND OF THE INVENTION

Field of Invention

The present invention relates to a high voltage device and a manufacturing method thereof; particularly, it relates to such a high voltage device having a reduced internal capacitance to improve transient response, and a manufacturing method thereof.

Description of Related Art

FIGS. 1A and 1B show schematic diagrams of a top view and a cross-sectional view respectively of a prior art double-diffused metal oxide semiconductor (DMOS) device 100. FIG. 1B is the cross-sectional view taken from the cross-section line AA' shown in FIG. 1A. The DMOS device 100 is a high voltage device designed for applications requiring higher operation voltages. In the context of the present invention, a "high voltage device" indicates a device which is capable of withstanding a voltage over 5V on a drain thereof in normal operation.

As shown in FIGS. 1A and 1B, an N-type high voltage well 102 is formed in a semiconductor substrate 101; an isolation region 103 is formed to define an operation region 103a, wherein the isolation region 103 may be a shallow trench isolation (STI) structure (not shown) or a local oxidation of silicon (LOCOS) structure as shown in FIG. 1B. In the operation region 103a, a field oxide region 104, a body region 105, a body contact 105a, a gate 106, a source 107, and a drain 108 are formed. Part of the gate 106 overlays the field oxide region 104. The N-type high voltage well 102 may be formed by implanting N-type impurities in the form of accelerated ions in an ion implantation process step, into a defined region. The source 107 and the drain 108 are formed by a lithography process (including a self-alignment process) and an ion implantation process, wherein the lithography process defines the implantation regions by a photoresist mask together with a self-alignment effect provided by all or a part of the gate 106 and the isolation region 103, and the ion implantation process implants N-type impurities to the implantation regions. The body region 105 and the body contact 105a are formed by a lithography process (including a self-alignment process) and an ion implantation process, wherein the lithography process defines the implantation regions by a photoresist mask together with a self-alignment effect provided by all or a part of the gate 106 and the isolation region 103, and the ion implantation process implants P-type impurities to the implantation regions. The source 107 and the drain 108 are located at two different sides of and below the gate 106 respectively, and part of the N-type high voltage well 102 separates the source 107 and the drain 108. Typically, the high voltage device has a drift region which separates the drain and the gate of the high voltage device, wherein a lateral length of the drift region is determined according to the threshold voltage that the high voltage device is designed to operate with. In this case, part of the N-type high voltage well 102 serves as the drift region.

In the DMOS device 100, when a junction between the P-type body region 105 and the N-type high voltage well 102 is reverse-biased, and/or when a junction between the N-type high voltage well 102 and the P-type semiconductor substrate 101 is reverse-biased, such junction is depleted because of the bias effect, forming an internal capacitor in the device. The internal capacitor will limit the transient response (i.e., switching speed) when the DMOS device 100 switches between ON and OFF. As the capacitance of the internal capacitor is higher, the switching speed becomes lower, and low switching speed limits the application range of the DMOS device 100.

In view of the above, to overcome the drawbacks in the prior art, the present invention proposes a high voltage device and a manufacturing method thereof, to improve the transient response and thus the application range of the device.

SUMMARY OF THE INVENTION

In one perspective, the present invention provides a high voltage device, which is formed in a semiconductor substrate, wherein the semiconductor substrate has a top surface and a bottom surface opposite to the top surface in a vertical direction, the high voltage device comprising: a first deep well having a first conductivity type, which is formed in the semiconductor substrate; a lateral lightly doped region, which overlays and contacts the first deep well; a high voltage well having a second conductivity type, which is formed in the semiconductor substrate, and is located beneath and in contact with the top surface in the vertical direction, and the high voltage well overlays and is in contact with the lateral lightly doped region, wherein part of the high voltage well serves as a drift region; an isolation region, which is formed on the top surface to define an operation region; a body region having the first conductivity type, which is formed in the semiconductor substrate and in the operation region, and is located beneath the top surface and in contact with the top surface in the vertical direction, wherein part of the body region serves as a switch channel region, and the high voltage well surrounds a periphery and a bottom of the body region; a gate, which is formed on the top surface in the operation region, and is stacked on and in contact with the top surface in the vertical direction, wherein the gate determines whether the high voltage device is conductive or nonconductive according to a gate voltage; a source having the second conductivity type, which is formed in the semiconductor substrate and in the operation region, and is stacked beneath and in contact with the top surface in the vertical direction, wherein the body region surrounds a periphery and a bottom of the source, wherein the source is located out of and below a first side of the gate and is adjacent to the gate in a lateral direction; a drain having the second conductivity type, which is formed in the semiconductor substrate and in the operation region, and is located beneath and in contact with the top surface, wherein the drain is located out of and below a second side of the gate, and is separated from the gate by the drift region in a lateral direction; and a first isolation well having the first conductivity type, which is located out of the operation region, and surrounds the operation region beneath the top surface, and extends from the top surface to the first deep well and is in contact with the first deep well; wherein the body region, the gate, the source and the drain are all in the operation region.

In one perspective, the present invention also provides a manufacturing method of a high voltage device. The manufacturing method includes: providing a semiconductor substrate, which has a top surface and a bottom surface opposite to the top surface in a vertical direction; forming a first deep well having a first conductivity type in the semiconductor substrate; forming a lateral lightly doped region, which overlays and contacts the first deep well; forming a high voltage well having a second conductivity type in the semiconductor substrate, the high voltage well being beneath and in contact with the top surface in the vertical direction, wherein the high voltage well overlays and is in contact with the lateral lightly doped region, wherein part of the high voltage well serves as a drift region; forming an isolation region on the top surface to define an operation region; forming a body region having the first conductivity type, which is formed in the semiconductor substrate and in the operation region, and is located beneath the top surface and in contact with the top surface in the vertical direction, wherein part of the body region serves as a switch channel region, and the high voltage well surrounds a periphery and a bottom of the body region; forming a gate on the top surface in the operation region, wherein the gate is stacked on and in contact with the top surface in the vertical direction, wherein the gate determines whether the high voltage device is conductive or nonconductive according to a gate voltage; forming a source having the second conductivity type in the semiconductor substrate and in the operation region, wherein the source is stacked beneath and in contact with the top surface in the vertical direction, wherein the body region surrounds a periphery and a bottom of the source, wherein the source is located out of and below a first side of the gate and is adjacent to the gate in a lateral direction; forming a drain having the second conductivity type in the semiconductor substrate and in the operation region, wherein the drain is located beneath and in contact with the top surface, wherein the drain is located out of and below a second side of the gate, and is separated from the gate by the drift region in a lateral direction; and forming a first isolation well having the first conductivity type out of the operation region, wherein the first isolation well surrounds the operation region beneath the top surface, and wherein the first isolation well extends from the top surface to the first deep well and is in contact with the first deep well; wherein the body region, the gate, the source and the drain are all in the operation region.

In one preferable embodiment, the high voltage device further includes: a second deep well having the second conductivity type, which is formed in the semiconductor substrate, and is located beneath and in contact with the first deep well and the first isolation well; and a second isolation well having the second conductivity type, which is located outside the first isolation well and surrounds the first isolation well beneath the top surface, the second isolation well extending from the top surface to the second deep well and being in contact with the second deep well In one preferable embodiment, a bottom depth of the high voltage well is deeper than a bottom depth of the body region.

In one preferable embodiment, a bottom depth of the high voltage well is not deeper than a bottom depth of the body region.

In one preferable embodiment, the high voltage device further includes a vertical lightly doped region, which is located between and adjacent to the body region and the high voltage well, and extends from the top surface to the lateral lightly doped region in the vertical direction.

In one preferable embodiment, the high voltage device further includes a field oxide region, which is stacked on and in contact with the top surface, and at least part of the gate near the drain is stacked on and in contact with field oxide region.

In one preferable embodiment, the lateral lightly doped region has the first conductivity type or the second conductivity type, and an impurity concentration of the lateral lightly doped region is lower than one tenth of an impurity concentration of the high voltage well.

In one preferable embodiment, the step of forming the lateral lightly doped region includes: in the step of forming the high voltage well, controlling a depth of the high voltage well such that the high voltage well does not contact the first deep well, wherein the lateral lightly doped region is formed in a vertical gap between the high voltage well and the first deep well.

The objectives, technical details, features, and effects of the present invention will be better understood with regard to the detailed description of the embodiments below.

BRIEF DESCRIPTION OF THE DRAWINGS

FIGS. 2A and 2B show a first embodiment of the present invention.

FIGS. 8A and 8B show a seventh embodiment of the present invention.

DESCRIPTION OF THE PREFERRED EMBODIMENTS

Figure 1A:
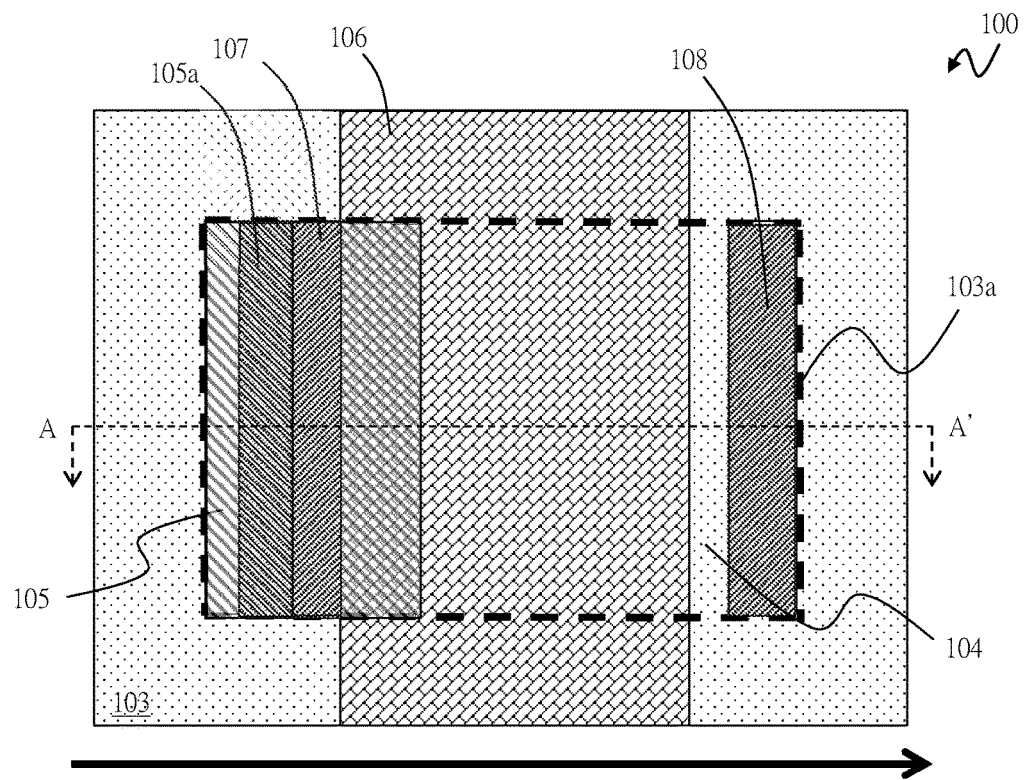
FIGS. 1A and 1B show schematic diagrams of a top view and a cross-sectional view respectively of a prior art double-diffused metal oxide semiconductor (DMOS) device 100.
Figure 1B:
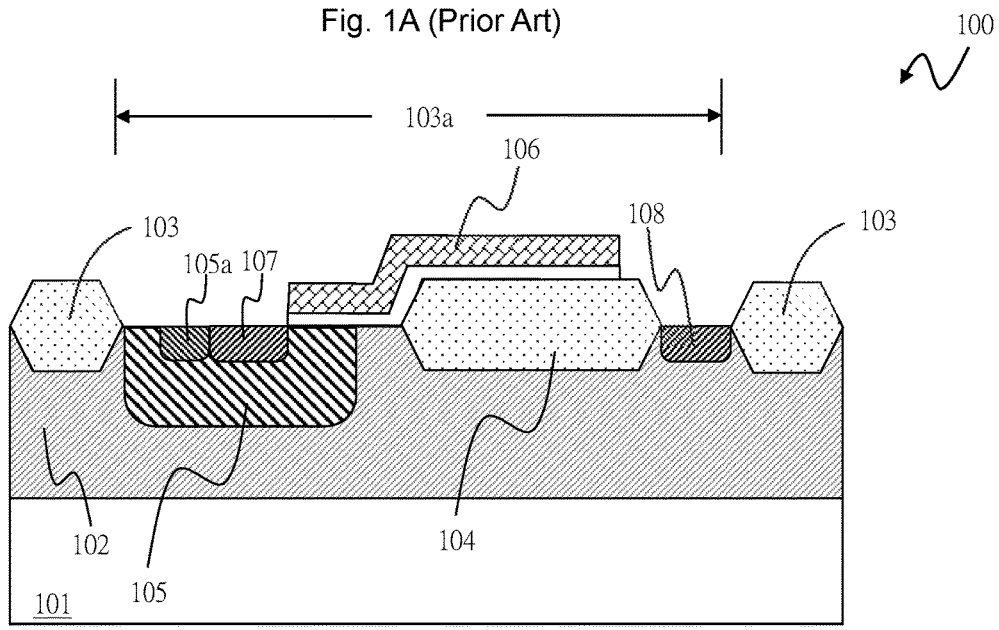

The drawings as referred to throughout the description of the present invention are for illustration only, to show the interrelations between the regions and the process steps, but not drawn according to actual scale.

Please refer to FIGS. 2A and 2B for a first embodiment according to the present invention. FIG. 2A shows a schematic diagram of a top view of high voltage devices 200 and 250. FIG. 2B is a cross-sectional view taken from the cross-section line BB' shown in FIG. 2A. As shown in FIGS. 2A and 2B, an isolation region 203 is formed in a semiconductor substrate 201, to define an operation region 203a. The isolation region 203 for example may be a shallow trench isolation (STI) structure, or a local oxidation of silicon (LOCOS) structure as shown in FIG. 2B. As shown in FIGS. 2A and 2B, two high voltage devices 200 and 250 are mirror arranged in the operation region 203a which is defined by the isolation region 203.

A high voltage well 202, a body region 205, a body contact 205a, a gate 206, a gate 256, a source 207, a source 257, a drain 208, a drain 258, a lateral lightly doped region 209, a first deep well 210, a first isolation well 211, and a first isolation well contact 211a are formed in the semiconductor substrate 201. The body region 205, the body contact 205a, the first isolation well 211, and the first isolation well contact 211a have a first conductivity type; and the high voltage well 202, the source 207, the source 257, the drain 208, and the drain 258 have a second conductivity type. The semiconductor substrate 201 is for example but not limited to a P-type silicon substrate, but certainly it can be other types of semiconductor substrates. The first conductivity type is for example but not limited to P-type, but it can be opposite, i.e., N-type which is opposite to the P-type. The second conductivity type is opposite to the first conductivity type, i.e., when the first conductivity type is the P-type, the second conductivity type is the N-type, and when the first conductivity type is the N-type, the second conductivity type is the P-type. The lateral lightly doped region 209 may be the first conductivity type or the second conductivity type, wherein an impurity concentration of the lateral lightly doped region 209 is lower than one tenth of an impurity concentration of the high voltage well 202. The lateral lightly doped region 209 for example can be formed by: in the step of forming the high voltage well 202, controlling the depth of the high voltage well 202 such that the high voltage well 202 does not contact the first deep well 210, that is, a vertical gap is formed between the high voltage well 202 and the first deep well 210, and the lateral lightly doped region 209 is formed in the vertical gap. More specifically, the parameters such as the acceleration voltage in an ion implantation process step for forming the high voltage well 202 are controlled such that the accelerated ions do not reach the first deep well 210, whereby the high voltage well 202 does not contact the first deep well 210 and the lateral lightly doped region 209 is formed in the vertical gap.

The body region 205, the body contact 205a, the first deep well 210, the first isolation well 211, and the first isolation well contact 211a are formed by an ion implantation process step, which implants the first conductivity type impurities to the defined region of the semiconductor substrate 201 in the form of accelerated ions. The high voltage well 202, the source 207, the source 257, the drain 208, and the drain 258 are formed by a lithography process step (including a self-alignment process step) which defines the aforementioned regions, and an ion implantation process step which implants the second conductivity type impurities to the defined regions in the form of accelerated ions. The lateral lightly doped region 209 overlays and contacts the first deep well 210. A drift region 202a (as indicated by a thin dashed frame shown in FIG. 2B) is located between the drain 208 and the body region 205 to separate the drain 208 and the body region 205, wherein a length in the lateral direction (as indicated by a solid arrow shown FIGS. 2A and 2B) of the drift region 202a is determined according to the operation voltage required for the high voltage device 200 to withstand in normal operation.

The high voltage device 200 is formed in the semiconductor substrate 201. The semiconductor substrate 201 has a top surface 201a (as indicated by a bold dashed polyline at the upper part of the semiconductor substrate 201 shown in FIG. 2B) and a bottom surface 201b (as indicated by a bold dashed polyline at the lower part of the semiconductor substrate 201 shown in FIG. 2B) opposite to the top surface 201a in a vertical direction (as indicated by a bold dashed arrow shown in FIG. 2B). The first deep well 210 which has the first conductivity type is formed in the semiconductor substrate 201. The lateral lightly doped region 209 overlays and contacts the first deep well 210. The high voltage well 202 having the second conductivity type is formed in the semiconductor substrate 201, and is located beneath and in contact with the top surface 201a in the vertical direction. The high voltage well 202 overlays and is in contact with the lateral lightly doped region 209, wherein part of the high voltage well 202 (as indicated by the thin dashed frame shown in FIG. 2B) serves as the drift region. The isolation region 203 is formed on the top surface 201a, and is configured to operably define the operation region 203a.

The body region 205 having the first conductivity type is formed in the semiconductor substrate 201 and in the operation region 203a, and is located beneath the top surface 201a and in contact with the top surface 201a in the vertical direction, wherein part of the body region 205 serves as a switch channel region 205b (as indicated by a bold solid frame shown in FIG. 2B). The high voltage well 202 surrounds the lateral periphery and the bottom of the body region 205. The gate 206 is formed on the top surface 201a in the operation region 203a, and is stacked on and in contact with the top surface 201a in the vertical direction, wherein the gate 206 determines whether the high voltage device 200 is conductive or nonconductive according to a gate voltage. Note that, the term "gate" in the context of this specification refers to a structure which includes a conductive layer, a dielectric layer, and a spacer layer. The conductive layer serves as an electrical contact of the gate 206, for receiving a gate voltage. The dielectric layer electrically isolates the conductive layer and the semiconductor substrate 201, so that the conductive layer does not directly connect the semiconductor substrate 201. The spacer layer covers the sidewalls of the conductive layer, and electrically isolates the conductive layer from nearby wirings and/or electrical contacts. The switch channel region 205b is a reverse region which is formed when the gate 206 receives a gate voltage which is sufficient to turn ON the high voltage device 200; and the drift region 202a refers to a region between the switch channel 205b and the drain 208, where a conductive current flows through. The switch channel region 205b and the drift region 202a are well known to those skilled in this art and therefore are not redundantly explained in detail here. The conductive current refers to a current flowing between the drain 208 and the source 207 when the high voltage device 200 is conductive, wherein a majority of the conductive current is distributed near the top surface 201a.

The source 207 having the second conductivity type is formed in the semiconductor substrate 201 and in the operation region 203a. The source 207 is stacked beneath and in contact with the top surface 201a in the vertical direction, wherein the body region 205 surrounds the lateral periphery and the bottom of the source 207. The source 207 is located out of and below a first side 206a of the gate 206 and is adjacent to the gate 206 in the lateral direction. The drain 208 having the second conductivity type is formed in the semiconductor substrate 201 and in the operation region 203a, and is located beneath and in contact with the top surface 201a. The drain 208 is located out of and below a second side 206b of the gate 206, and is separated from the gate 206 by the drift region 202a in the lateral direction. The first isolation well 211 having the first conductivity type is located out of the operation region 203a, and surrounds the operation region 203a; the first isolation well 211 extends from the top surface 201a to the first deep well 210 and is in contact with the first deep well 201, wherein the body region 205, the gate 206, the source 207 and the drain 208 are all in the operation region 203a. Note that, the high voltage device 200 and the high voltage 250 are mirror arranged in the semiconductor substrate 201, and share the same high voltage well 202, the body region 205, the body contact 205a, the lateral lightly doped region 209, the first deep well 210, the first isolation well 211, and the first isolation well contact 211a. The first isolation well contact 211a is formed beneath and in contact with the top surface 201a, and is electrically connected to the first isolation well 211; the first isolation well contact 211a serves as an electrical contact of the first isolation well 211.

Figure 3A:
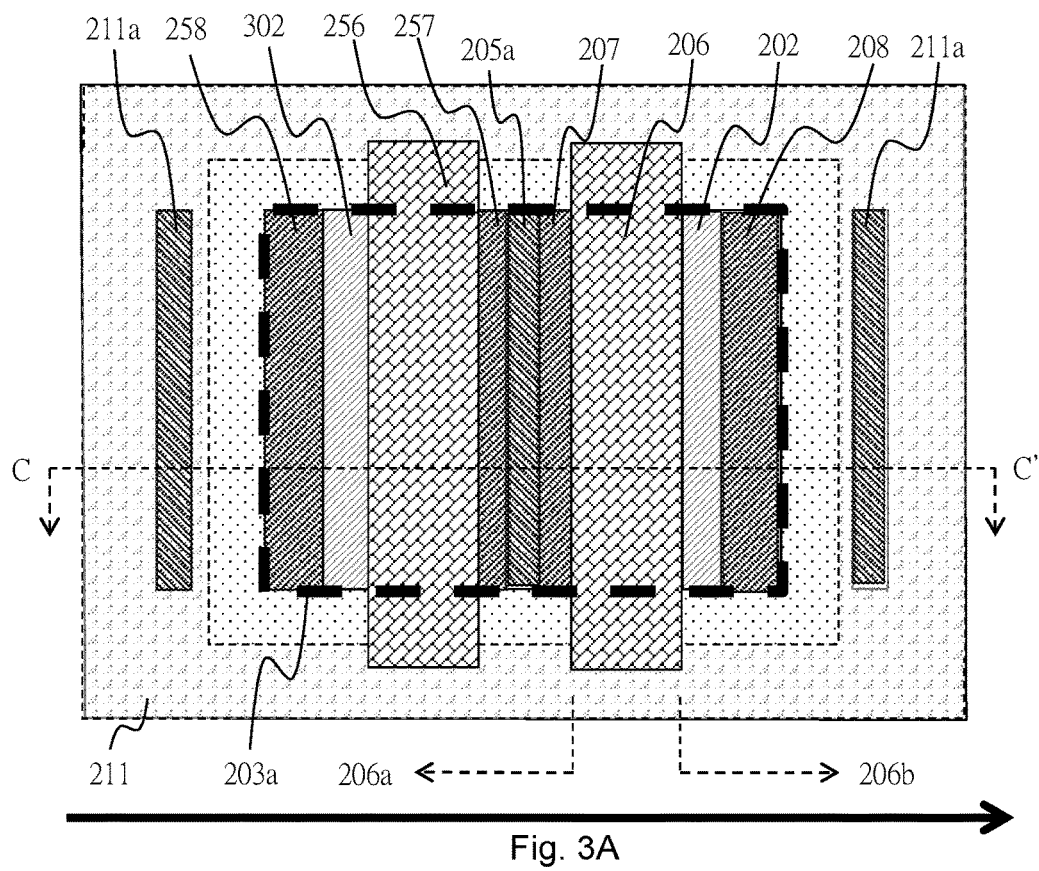
FIGS. 3A and 3B show a second embodiment of the present invention.
Figure 3B:
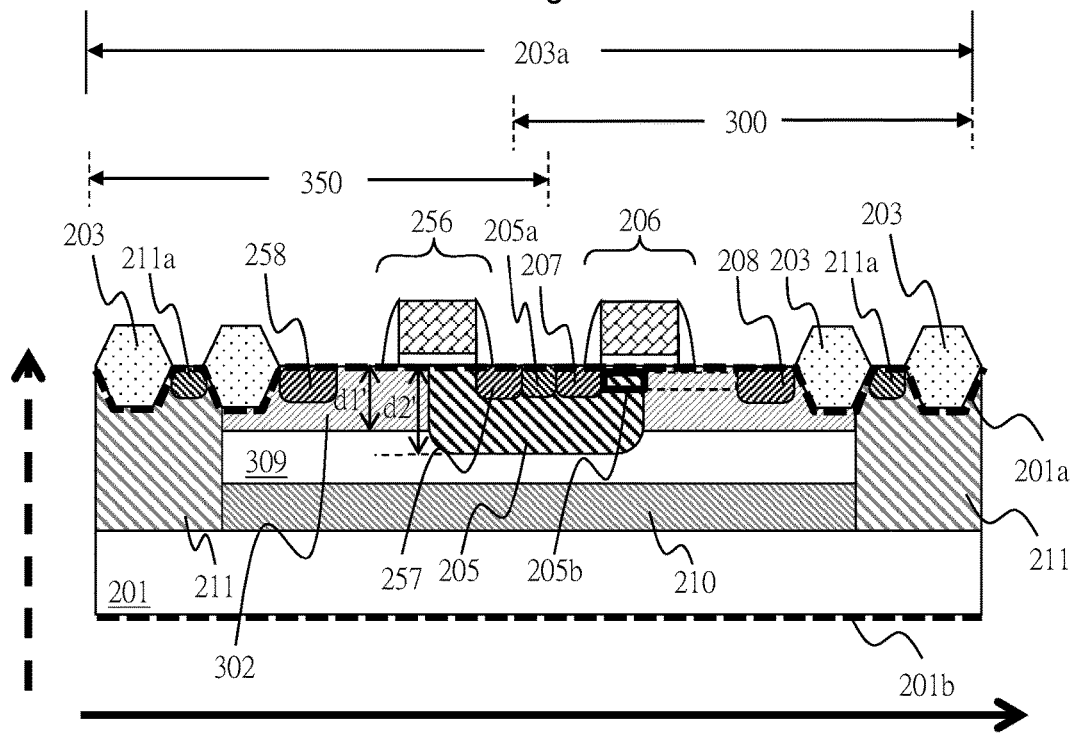

Please refer to FIGS. 3A and 3B for a second embodiment according to the present invention. FIG. 3A shows a schematic diagram of a top view of high voltage devices 300 and 350. FIG. 3B is a cross-sectional view taken from the cross-section line CC' shown in FIG. 3A. As shown in FIGS. 3A and 3B, the isolation region 203 is formed in the semiconductor substrate 201, to define the operation region 203a. As shown in FIGS. 3A and 3B, two high voltage devices 300 and 350 are mirror arranged in the operation region 203a which is defined by the isolation region 203.

A high voltage well 302, the body region 205, the body contact 205a, the gate 206, the gate 256, the source 207, the source 257, the drain 208, the drain 258, a lateral lightly doped region 309, the first deep well 210, the first isolation well 211, and the first isolation well contact 211a are formed in the semiconductor substrate 201. This embodiment is different from the first embodiment in that, in the first embodiment, the high voltage well 202 has a bottom depth (depth measured according to its bottom) d1, which is deeper than a bottom depth d2 of the body region 205; but in this embodiment, the high voltage well 302 has a bottom depth d1', which is not deeper than a bottom depth d2' of the body region 205.

Figure 4A:
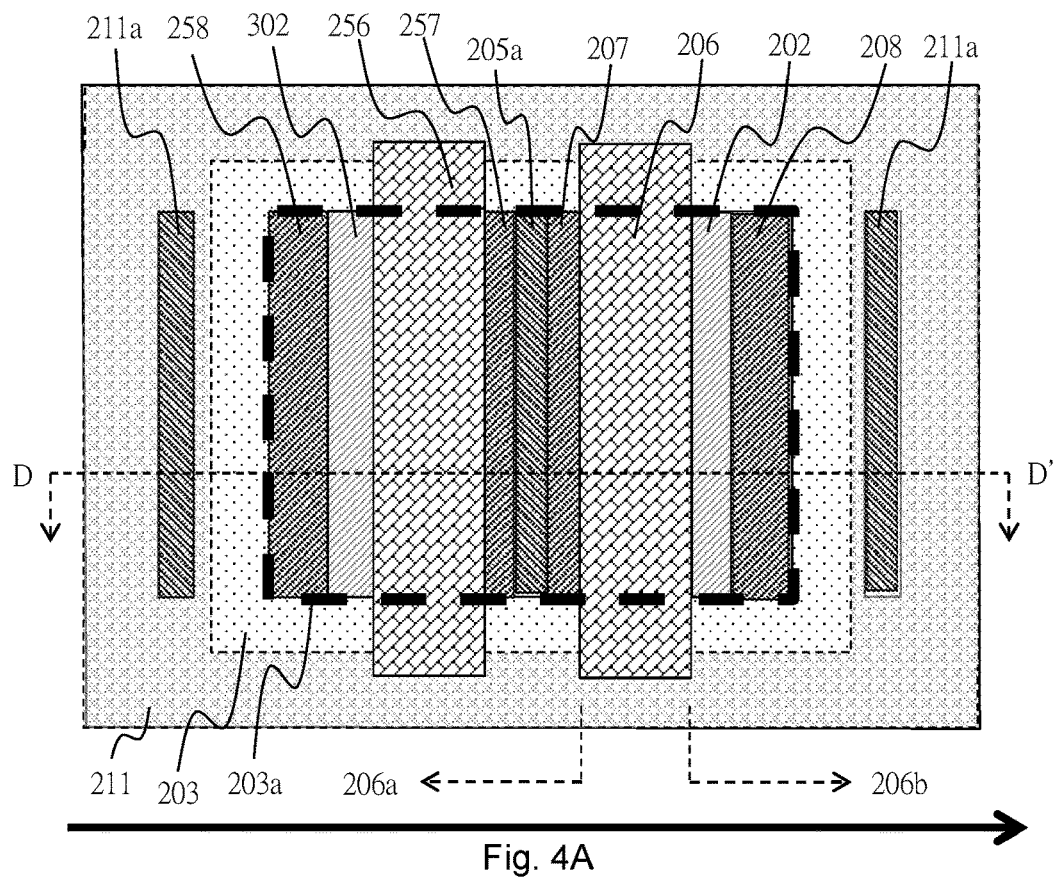
FIGS. 4A and 4B show a third embodiment of the present invention.
Figure 4B:
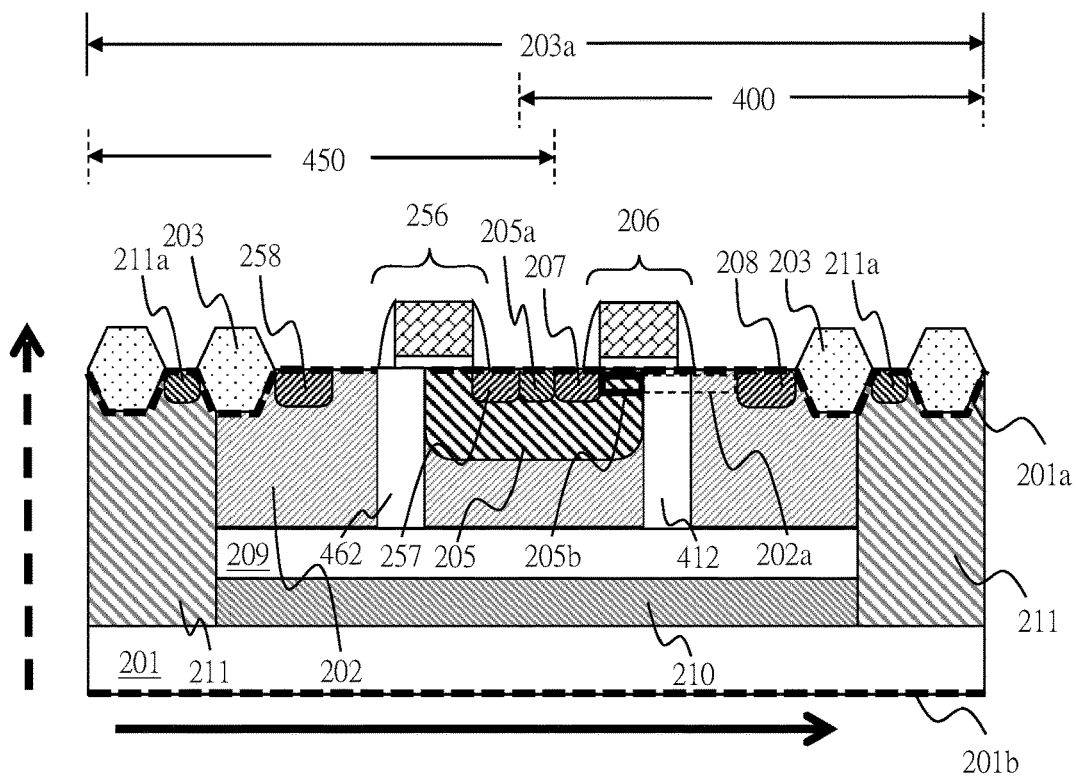

Please refer to FIGS. 4A and 4B for a third embodiment according to the present invention. FIG. 4A shows a schematic diagram of a top view of high voltage devices 400 and 450. FIG. 4B is a cross-sectional view taken from the cross-section line DD' shown in FIG. 4A. As shown in FIGS. 4A and 4B, the isolation region 203 is formed in the semiconductor substrate 201, to define the operation region 203a. As shown in FIGS. 4A and 4B, two high voltage devices 400 and 450 are mirror arranged in the operation region 203a which is defined by the isolation region 203.

The high voltage well 202, the body region 205, the body contact 205a, the gate 206, the gate 256, the source 207, the source 257, the drain 208, the drain 258, the lateral lightly doped region 209, the first deep well 210, the first isolation well 211, the first isolation well contact 211a, a vertical lightly doped region 412, and a vertical lightly doped region 462 are formed in the semiconductor substrate 201. This embodiment is different from the first embodiment in that, in this embodiment, the high voltage devices 400 and 450 further include the vertical lightly doped regions 412 and 462 respectively. The vertical lightly doped region 412 is located between and adjacent to the body region 205 and the high voltage well 202, and extends from the top surface 201a to the lateral lightly doped region 209 in the vertical direction. The vertical lightly doped region 412 has the first conductivity type or the second conductivity type, and an impurity concentration of the vertical lightly doped region 412 is for example lower than one tenth of an impurity concentration of the high voltage well 202. The vertical lightly doped region 412 for example can be formed by: in an ion implantation process step for forming the high voltage well 202, masking a defined region of the vertical lightly doped region 412 by a photo resist layer or a hard mask to block implantation into the defined region, to form the vertical lightly doped region 412.

Figures 5A, 5B:
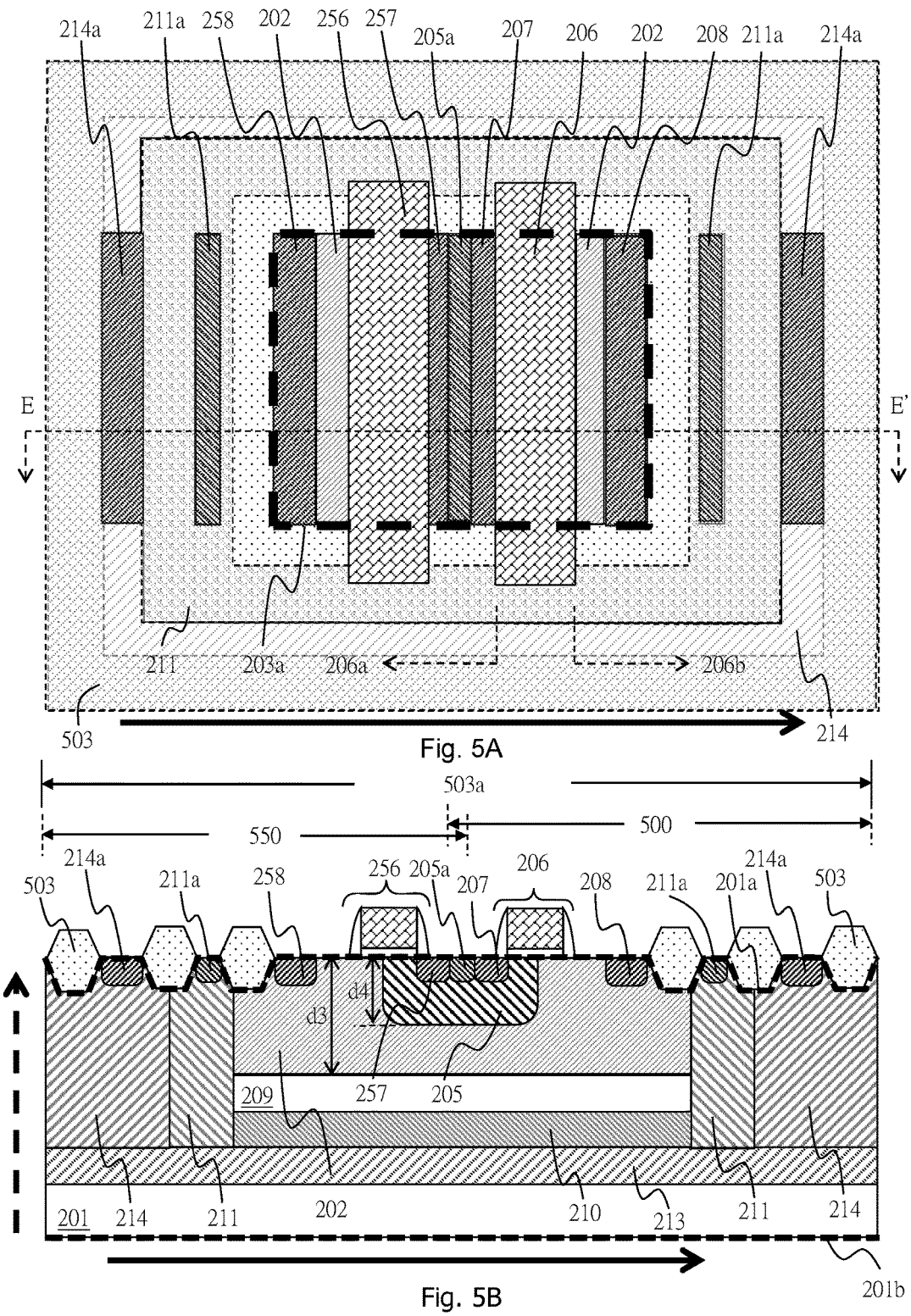
FIGS. 5A and 5B show a fourth embodiment of the present invention.

Please refer to FIGS. 5A and 5B for a fourth embodiment according to the present invention. FIG. 5A shows a schematic diagram of a top view of high voltage devices 500 and 550. FIG. 5B is a schematic diagram taken from the cross-section line EE' shown in FIG. 5A. As shown in FIGS. 5A and 5B, the isolation region 503 is formed in the semiconductor substrate 201, to define the operation region 503a. As shown in FIGS. 5A and 5B, two high voltage devices 500 and 550 are mirror arranged in the operation region 503a which is defined by the isolation region 503.

The high voltage well 202, the body region 205, the body contact 205a, the gate 206, the gate 256, the source 207, the source 257, the drain 208, the drain 258, the lateral lightly doped region 209, the first deep well 210, the first isolation well 211, the first isolation well contact 211a, a second deep well 213, a second isolation well 214, and the second isolation well contact 214a are formed in the semiconductor substrate 201. This embodiment is different from the first embodiment in that, in this embodiment, the high voltage devices 500 further includes the second deep well 213 and the second isolation well 214. The second deep well 213 having the second conductivity type is formed in the semiconductor substrate 201, and is located beneath and in contact with the first deep well 210 and the first isolation well 211. The second isolation well 214 having the second conductivity type is located outside the first isolation well 211 and surrounds the first isolation well 211; the second isolation well 214 extends from the top surface 201a to the second deep well 213 and is in contact with the second deep well 213. The second isolation well contact 214a is formed beneath and in contact with the top surface 201a, and is electrically connected to the second isolation well 214, serving as an electrical contact of the second isolation well 214. Note that, the high voltage device 500 and the high voltage 550 are mirror arranged in the semiconductor substrate 201, and share the same high voltage well 202, the body region 205, the body contact 205a, the lateral lightly doped region 209, the first deep well 210, the first isolation well 211, the first isolation well contact 211a, the second deep well 213, the second isolation well 214, and the second isolation well contact 214a.

Figure 6A:
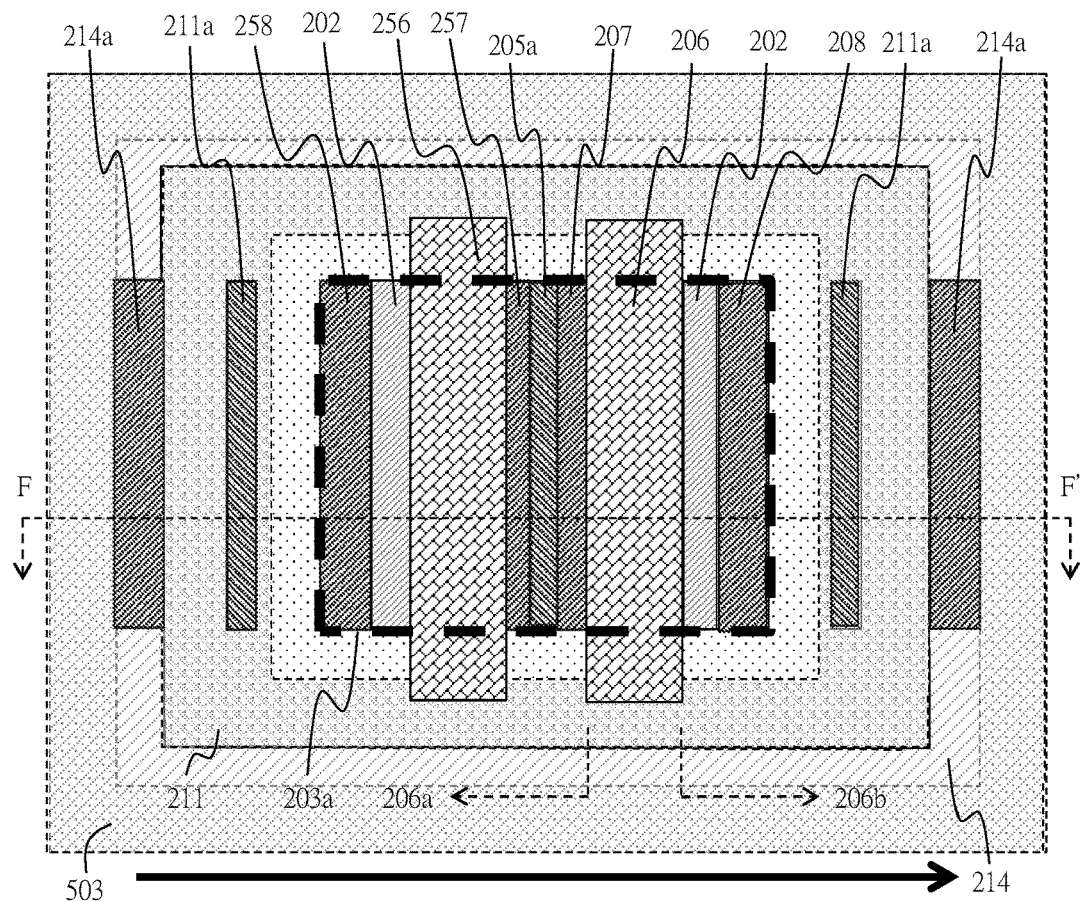
FIGS. 6A and 6B show a fifth embodiment of the present invention.
Figure 6B:
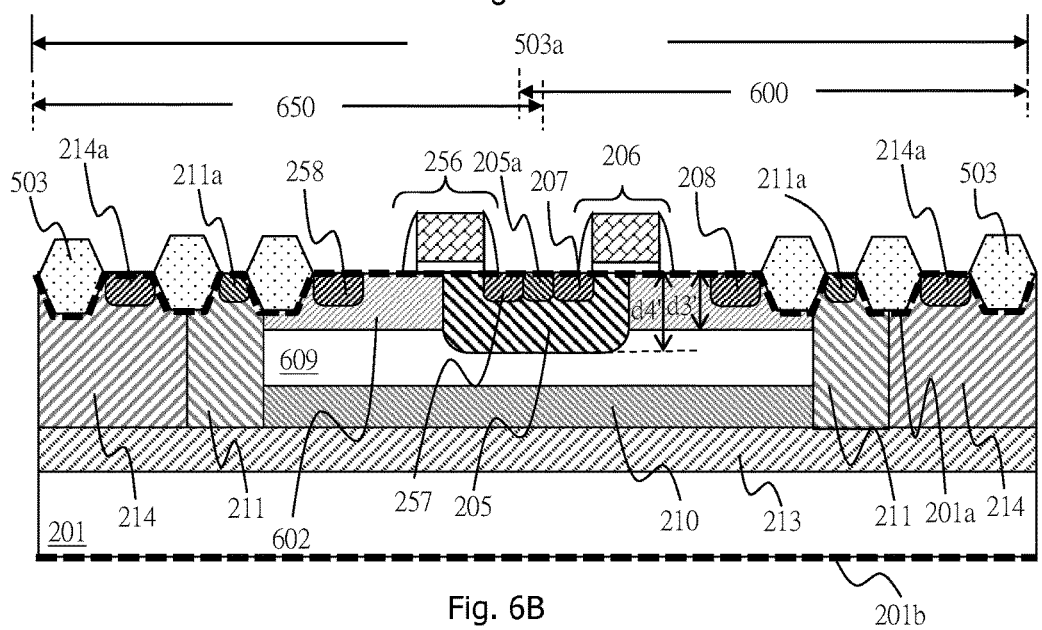

Please refer to FIGS. 6A and 6B for a fifth embodiment according to the present invention. FIG. 6A shows a schematic diagram of a top view of high voltage devices 600 and 650. FIG. 6B is a cross-sectional view taken from the cross-section line FF' shown in FIG. 6A. As shown in FIGS. 6A and 6B, the isolation region 503 is formed in the semiconductor substrate 201, to define the operation region 503a. As shown in FIGS. 6A and 6B, two high voltage devices 600 and 650 are mirror arranged in the operation region 503a which is defined by the isolation region 503.

The high voltage well 602, the body region 205, the body contact 205a, the gate 206, the gate 256, the source 207, the source 257, the drain 208, the drain 258, a lateral lightly doped region 609, the first deep well 210, the first isolation well 211, the first isolation well contact 211a, the second deep well 213, the second isolation well 214, and the second isolation well contact 214a are formed in the semiconductor substrate 201. This embodiment is different from the fourth embodiment in that, in the fourth embodiment, the high voltage well 202 has a bottom depth d3, which is deeper than a bottom depth d4 of the body region 205; but in this embodiment, the high voltage well 602 has a bottom depth d3', which is not deeper than a bottom depth d4' of the body region 205.

Figure 7A:
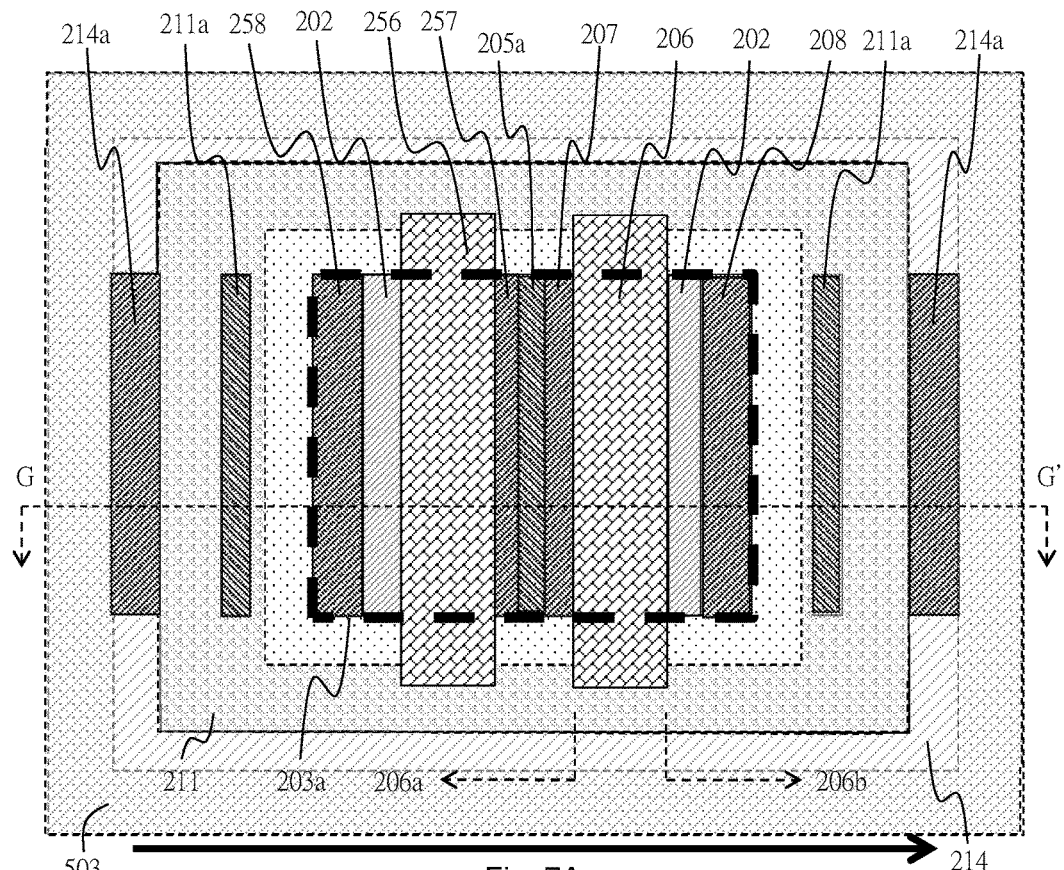
FIGS. 7A and 7B show a sixth embodiment of the present invention.
Figure 7B:
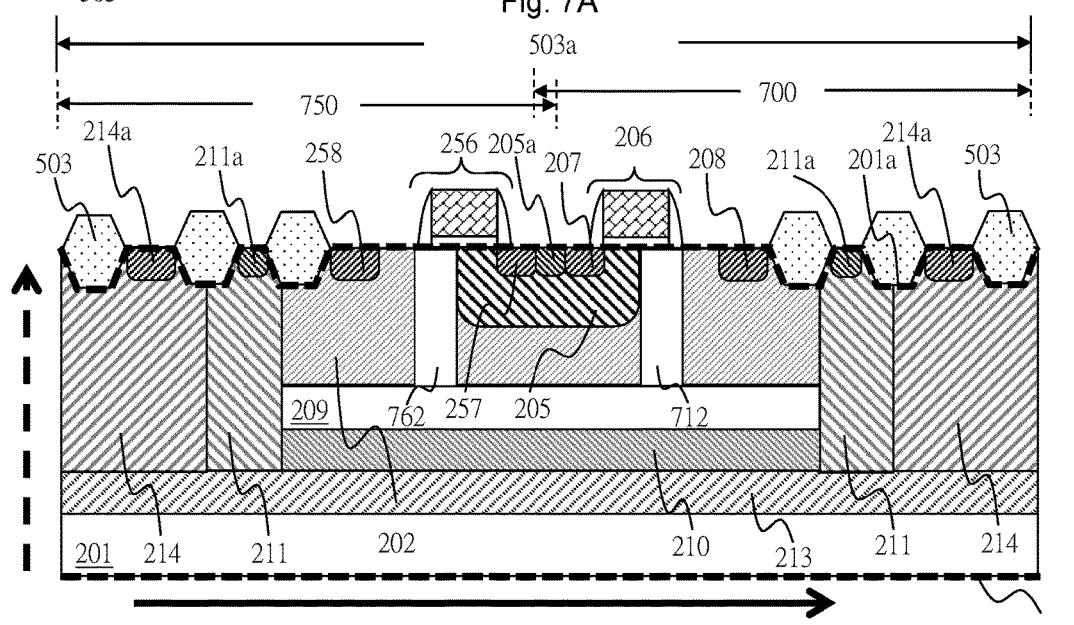

Please refer to FIGS. 7A and 7B for a sixth embodiment according to the present invention. FIG. 7A shows a schematic diagram of a top view of high voltage devices 700 and 750. FIG. 7B is a cross-sectional view taken from the cross-section line GG' shown in FIG. 7A. As shown in FIGS. 7A and 7B, the isolation region 503 is formed in the semiconductor substrate 201, to define the operation region 503a. As shown in FIGS. 7A and 7B, two high voltage devices 700 and 750 are mirror arranged in the operation region 503a which is defined by the isolation region 503.

The high voltage well 202, the body region 205, the body contact 205a, the gate 206, the gate 256, the source 207, the source 257, the drain 208, the drain 258, the lateral lightly doped region 209, the first deep well 210, the first isolation well 211, the first isolation well contact 211a, the second deep well 213, the second isolation well 214, the second isolation well contact 214a, a vertical lightly doped region 712, and a vertical lightly doped region 762 are formed in the semiconductor substrate 201. This embodiment is different from the fourth embodiment in that, in this embodiment, the high voltage devices 700 and 750 further include the vertical lightly doped regions 712 and 762 respectively. The vertical lightly doped region 712 is located between and adjacent to the body region 205 and the high voltage well 202, and extends from the top surface 201a to the lateral lightly doped region 209 in the vertical direction. The vertical lightly doped region 712 has the first conductivity type or the second conductivity type, and an impurity concentration of the vertical lightly doped region 712 is for example lower than one tenth of the impurity concentration of the high voltage well 202. The vertical lightly doped region 712 for example can be formed by: in the ion implantation process step for forming the high voltage well 202, masking a defined region of the vertical lightly doped region 712 by a photo resist layer or a hard mask to block implantation into the defined region, to form the vertical lightly doped region 712.

Please refer to FIGS. 8A and 8B for a seventh embodiment according to the present invention. FIG. 8A shows a schematic diagram of a top view of high voltage devices 800 and 850. FIG. 8B is a cross-sectional view taken from the cross-section line HH' shown in FIG. 8A. As shown in FIGS. 8A and 8B, the isolation region 203 is formed in the semiconductor substrate 201, to define the operation region 203a. As shown in FIGS. 8A and 8B, two high voltage devices 800 and 850 are mirror arranged in the operation region 203a which is defined by the isolation region 203.

The high voltage well 202, the body region 205, the body contact 205a, a gate 806, a gate 856, the source 207, the source 257, the drain 208, the drain 258, the lateral lightly doped region 209, the first deep well 210, the first isolation well 211, and the first isolation well contact 211a are formed in the semiconductor substrate 201. This embodiment is different from the first embodiment in that, in this embodiment, the high voltage devices 800 and 850 further include field oxide regions 803 and 853 respectively. The field oxide regions 803 is stacked on and in contact with the top surface 201a, and at least part of the gate 806 near the drain 208 is stacked on and in contact with field oxide region 803. The field oxide regions 853 is stacked on and in contact with the top surface 201a, and at least part of the gate 856 near the drain 258 is stacked on and in contact with field oxide region 853. Note that, the high voltage device 800 and the high voltage 850 are mirror arranged in the semiconductor substrate 201, and share the same high voltage well 202, the body region 205, the body contact 205a, the lateral lightly doped region 209, the first deep well 210, the first isolation well 211, and the first isolation well contact 211a.

Figure 9A:
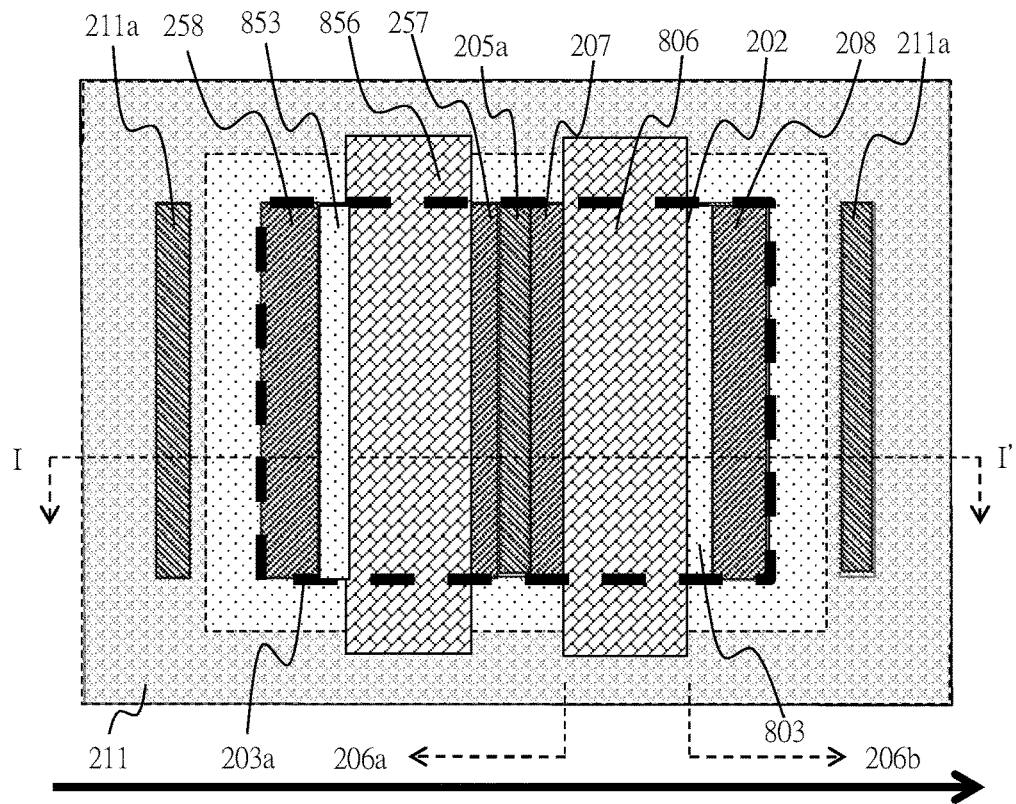
FIGS. 9A and 9B show an eighth embodiment of the present invention.
Figure 9B:
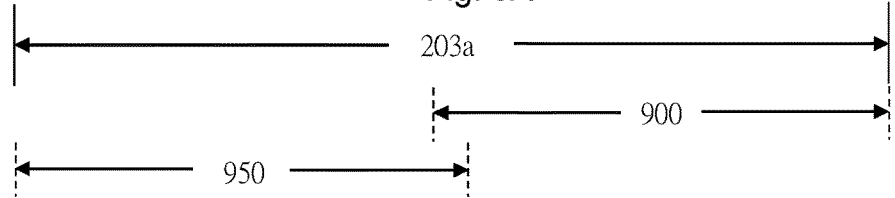
Figure 9B:
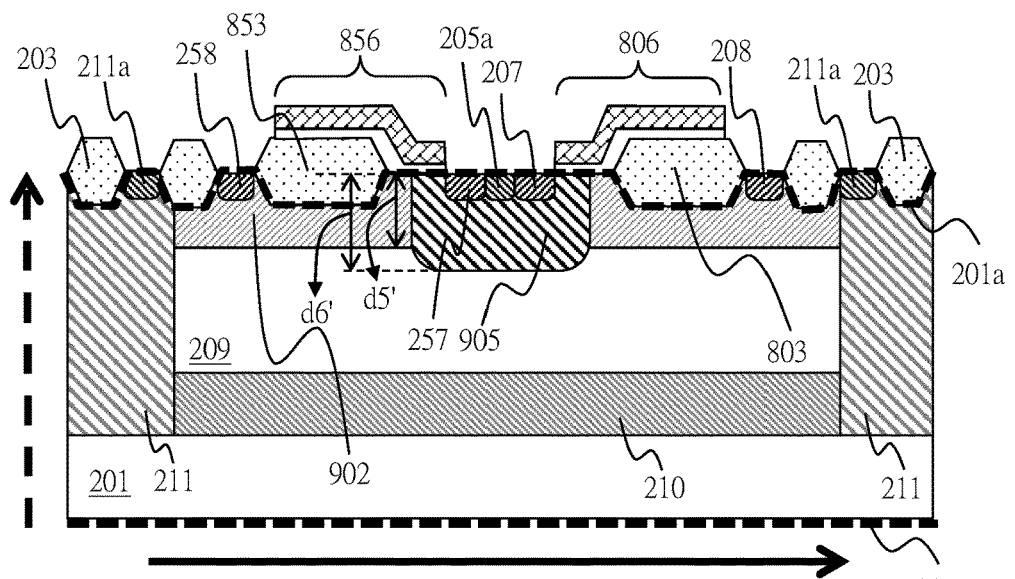

Please refer to FIGS. 9A and 9B for an eighth embodiment according to the present invention. FIG. 9A shows a schematic diagram of a top view of high voltage devices 900 and 950. FIG. 9B is a cross-sectional view taken from the cross-section line II' shown in FIG. 9A. As shown in FIGS. 9A and 9B, the isolation region 203 is formed in the semiconductor substrate 201, to define the operation region 203a. As shown in FIGS. 9A and 9B, two high voltage devices 900 and 950 are mirror arranged in the operation region 203a which is defined by the isolation region 203.

A high voltage well 902, a body region 905, the body contact 205a, the gate 806, the gate 856, the source 207, the source 257, the drain 208, the drain 258, the lateral lightly doped region 209, the first deep well 210, the first isolation well 211, and the first isolation well contact 211a are formed in the semiconductor substrate 201. This embodiment is different from the seventh embodiment in that, in the seventh embodiment, the high voltage well 202 has a bottom depth d5, which is deeper than a bottom depth d6 of the body region 205; but in this embodiment, the high voltage well 902 has a bottom depth d5', which is not deeper than a bottom depth d6' of the body region 905.

Figure 10A:
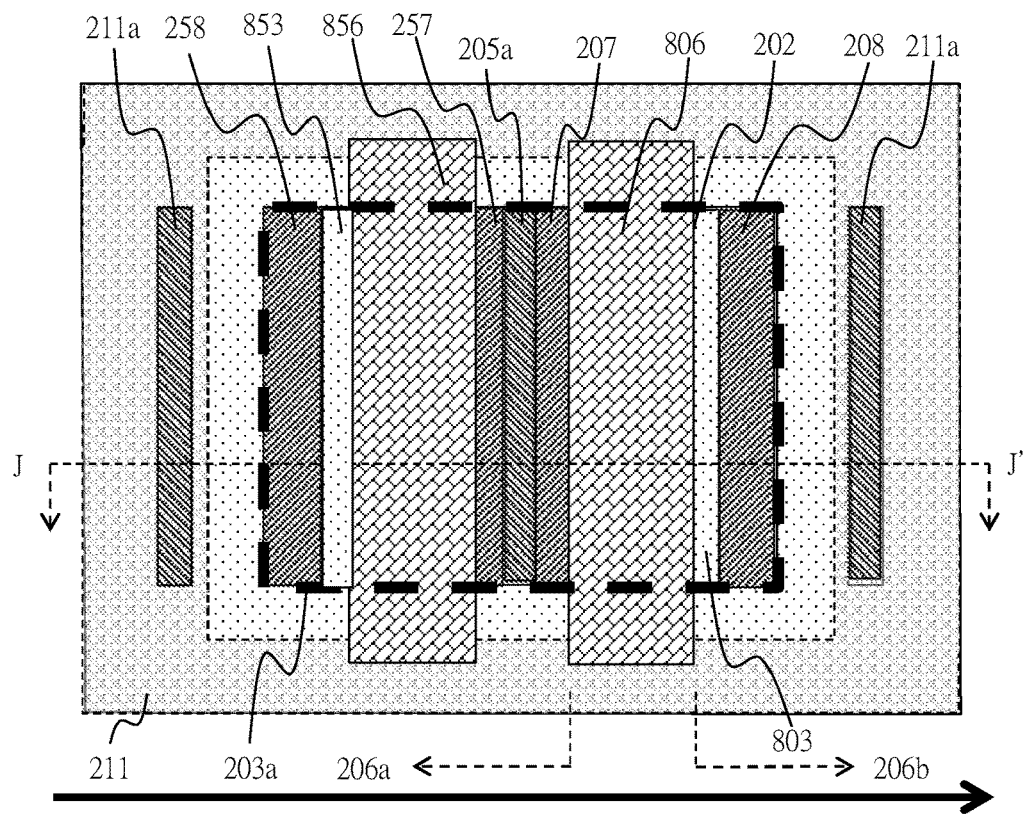
FIGS. 10A and 10B show a ninth embodiment of the present invention.
Figure 10B:
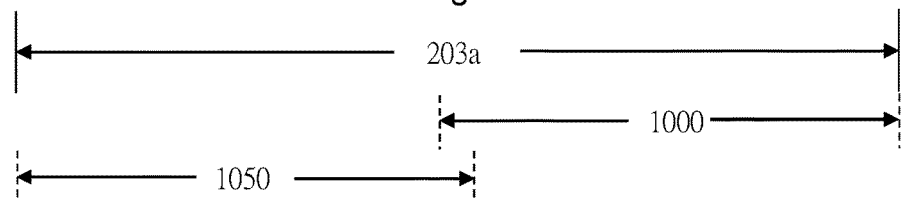
Figure 10B:
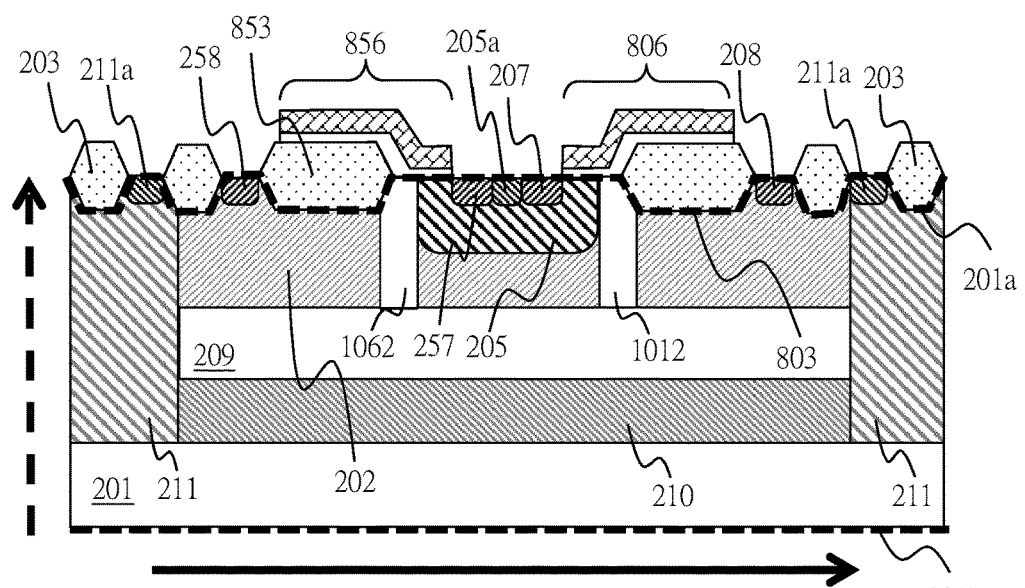

Please refer to FIGS. 10A and 10B for a ninth embodiment according to the present invention. FIG. 10A shows a schematic diagram of a top view of high voltage devices 1000 and 1050. FIG. 10B is a cross-sectional view taken from the cross-section line JJ' shown in FIG. 10A. As shown in FIGS. 10A and 10B, the isolation region 203 is formed in the semiconductor substrate 201, to define the operation region 203a. As shown in FIGS. 10A and 10B, two high voltage devices 1000 and 1050 are mirror arranged in the operation region 203a which is defined by the isolation region 203.

The high voltage well 202, the body region 205, the body contact 205a, the gate 806, the gate 856, the source 207, the source 257, the drain 208, the drain 258, the lateral lightly doped region 209, the first deep well 210, the first isolation well 211, the first isolation well contact 211a, a vertical lightly doped region 1012, and a vertical lightly doped region 1062 are formed in the semiconductor substrate 201. This embodiment is different from the seventh embodiment in that, in this embodiment, the high voltage devices 1000 and 1050 further include the vertical lightly doped regions 1012 and 1062 respectively. The vertical lightly doped region 1012 is located between and adjacent to the body region 205 and the high voltage well 202, and extends from the top surface 201a to the lateral lightly doped region 209 in the vertical direction. The vertical lightly doped region 1012 has the first conductivity type or the second conductivity type, and an impurity concentration of the vertical lightly doped region 1012 is for example lower than one tenth of the impurity concentration of the high voltage well 202. The vertical lightly doped region 1012 for example can be formed by: in the ion implantation process step for forming the high voltage well 202, masking a defined region of the vertical lightly doped region 1012 by a photo resist layer or a hard mask to block implantation into the defined region, to form the vertical lightly doped region 1012.

Figure 11A:
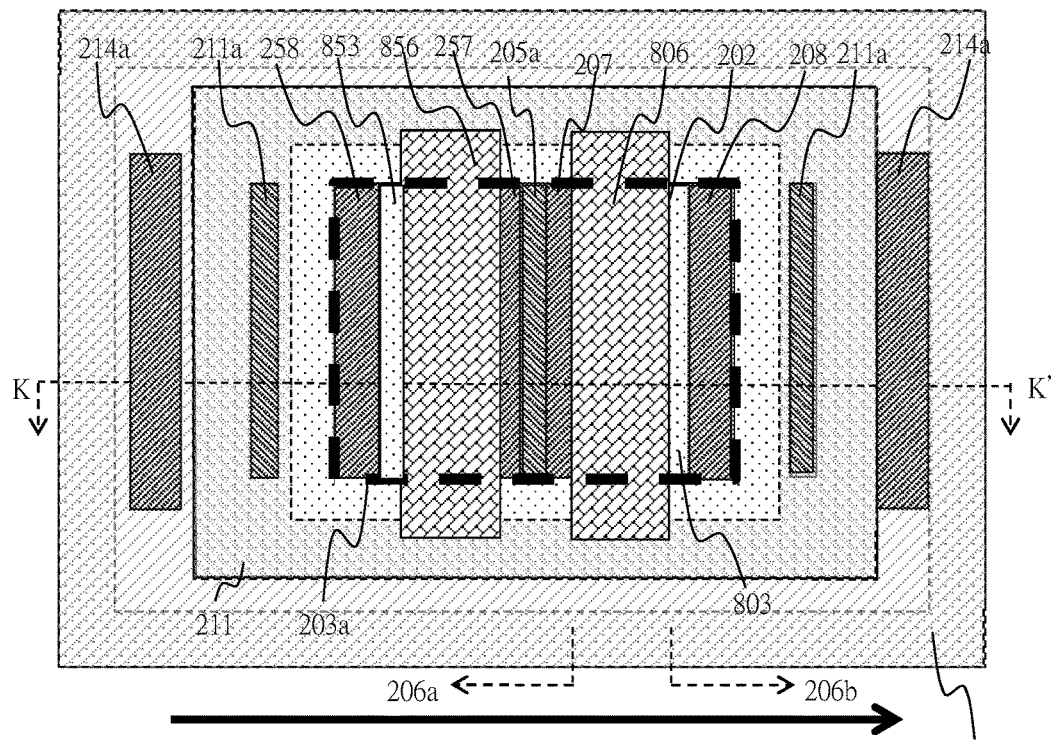
FIGS. 11A and 11B show a tenth embodiment of the present invention.
Figure 11B:
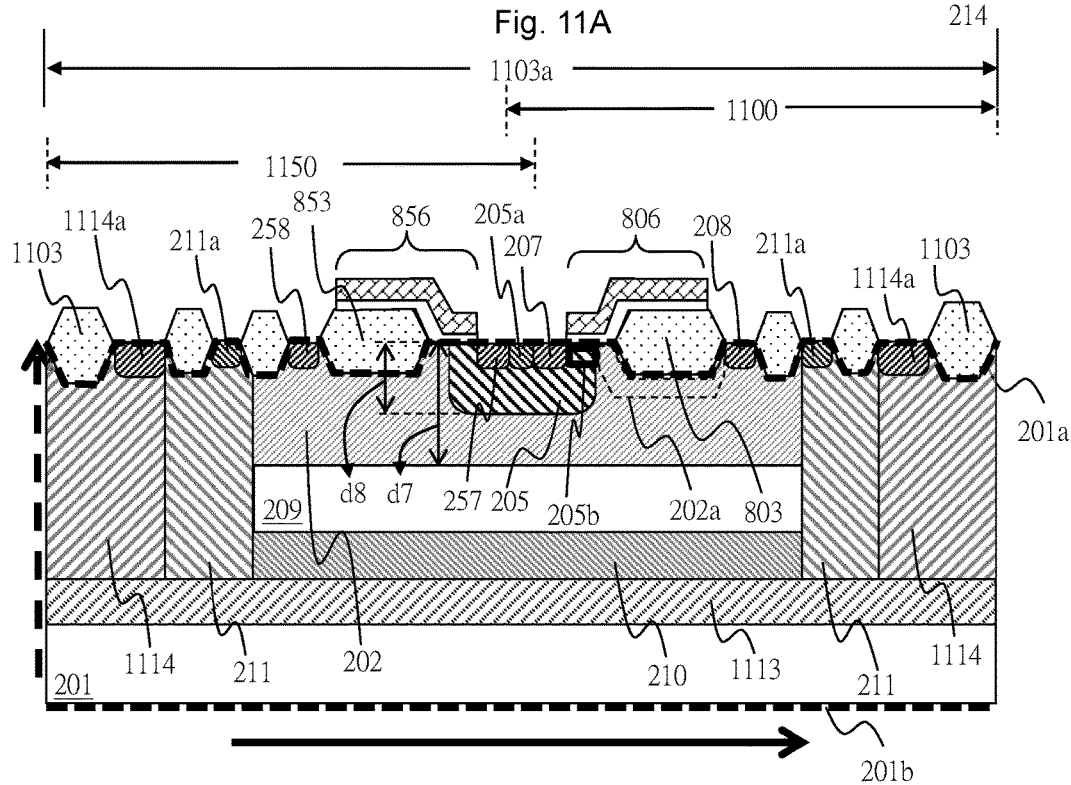

Please refer to FIGS. 11A and 11B for a tenth embodiment according to the present invention. FIG. 11A shows a schematic diagram of a top view of high voltage devices 1100 and 1150. FIG. 11B is a cross-sectional view taken from the cross-section line KK' shown in FIG. 11A. As shown in FIGS. 11A and 11B, the isolation region 1103 is formed in the semiconductor substrate 201, to define the operation region 1103a. As shown in FIGS. 11A and 11B, two high voltage devices 1100 and 1150 are mirror arranged in the operation region 1103a which is defined by the isolation region 1103.

The high voltage well 202, the body region 205, the body contact 205a, the gate 806, the gate 856, the source 207, the source 257, the drain 208, the drain 258, the lateral lightly doped region 209, the first deep well 210, the first isolation well 211, the first isolation well contact 211a, a second deep well 1113, a second isolation well 1114, and the second isolation well contact 1114a are formed in the semiconductor substrate 201. This embodiment is different from the seventh embodiment in that, in this embodiment, the high voltage devices 1100 further includes the second deep well 1113 and the second isolation well 1114. The second deep well 1113 having the second conductivity type is formed in the semiconductor substrate 201, and is located beneath and in contact with the first deep well 210 and the first isolation well 211. The second isolation well 1114 having the second conductivity type is located outside the first isolation well 211, and surrounds the first isolation well 211. The second isolation well 1114 extends from the top surface 201a to the second deep well 213 and is in contact with the second deep well 213. The second isolation well contact 214a is formed beneath and in contact with the top surface 201a, and is electrically connected to the second isolation well 1114, serving as an electrical contact of the second isolation well 1114. Note that, the high voltage device 1100 and the high voltage 1150 are mirror arranged in the semiconductor substrate 201, and share the same high voltage well 202, the body region 205, the body contact 205a, the lateral lightly doped region 209, the first deep well 210, the first isolation well 211, the first isolation well contact 211a, the second deep well 1113, the second isolation well 1114, and the second isolation well contact 1114a.

Figure 12A:
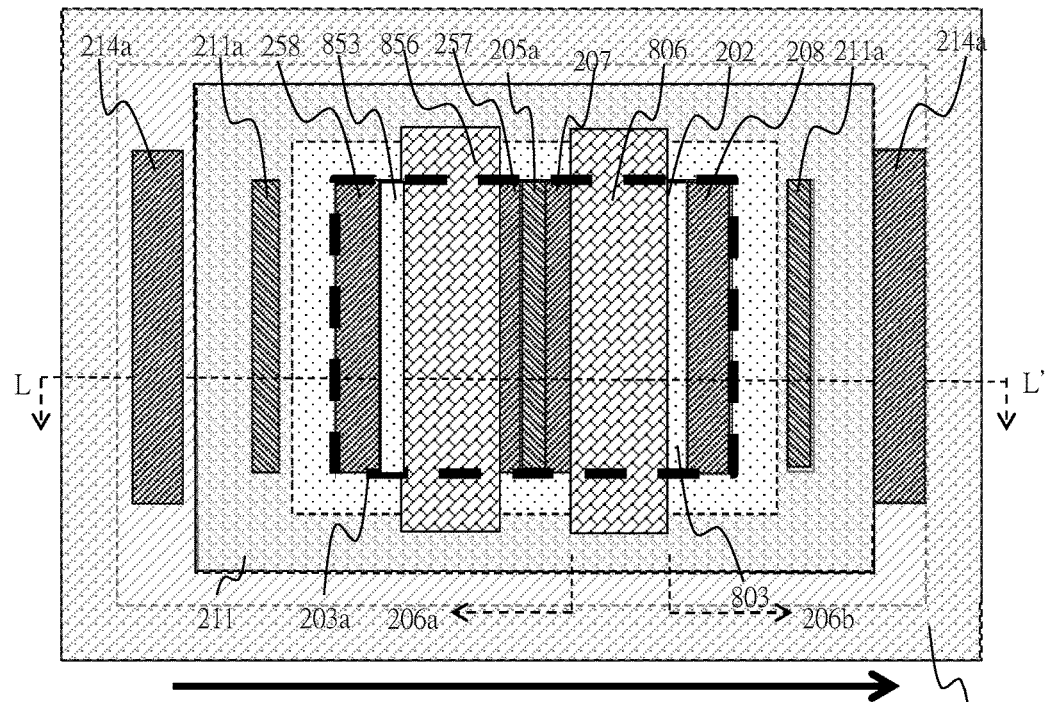
FIGS. 12A and 12B show an eleventh embodiment of the present invention.
Figure 12B:
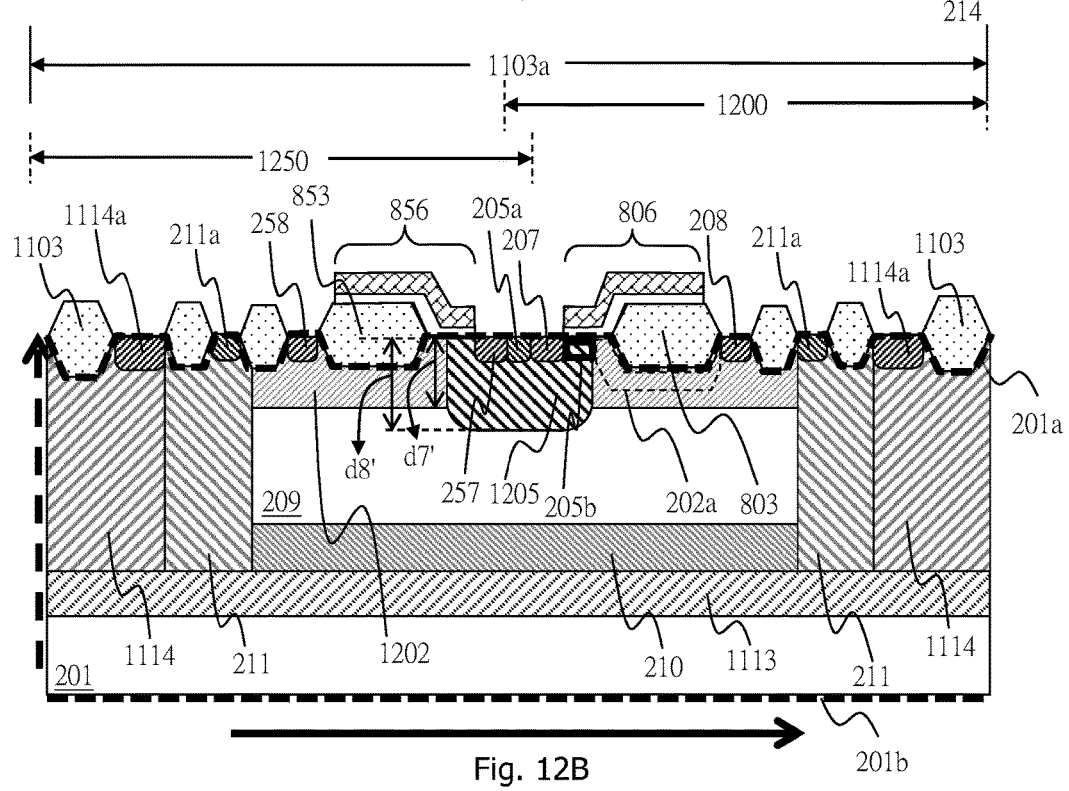

Please refer to FIGS. 12A and 12B for an eleventh embodiment according to the present invention. FIG. 12A shows a schematic diagram of a top view of high voltage devices 1200 and 1250. FIG. 12B is a cross-sectional view taken from the cross-section line LL' shown in FIG. 12A. As shown in FIGS. 12A and 12B, the isolation region 1103 is formed in the semiconductor substrate 201, to define the operation region 1103a. As shown in FIGS. 12A and 12B, two high voltage devices 1200 and 1250 are mirror arranged in the operation region 1103a which is defined by the isolation region 1103.

The high voltage well 1202, the body region 1205, the body contact 205a, the gate 806, the gate 856, the source 207, the source 257, the drain 208, the drain 258, a lateral lightly doped region 209, the first deep well 210, the first isolation well 211, the first isolation well contact 211a, the second deep well 213, the second isolation well 1114, and the second isolation well contact 1114a are formed in the semiconductor substrate 201. This embodiment is different from the tenth embodiment in that, in the tenth embodiment, the high voltage well 202 has a bottom depth d7, which is deeper than a bottom depth d8 of the body region 205; but in this embodiment, the high voltage well 1202 has a bottom depth d7', which is not deeper than a bottom depth d8' of the body region 1205.

Figure 13A:
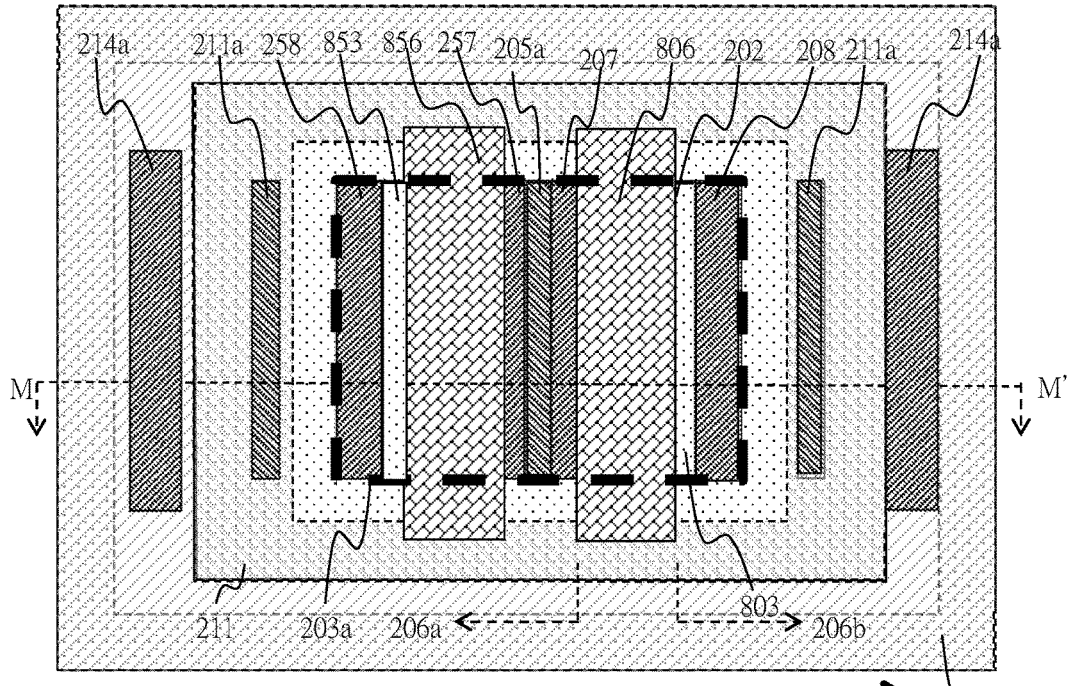
FIGS. 13A and 13B show a twelfth embodiment of the present invention.
Figure 13B:
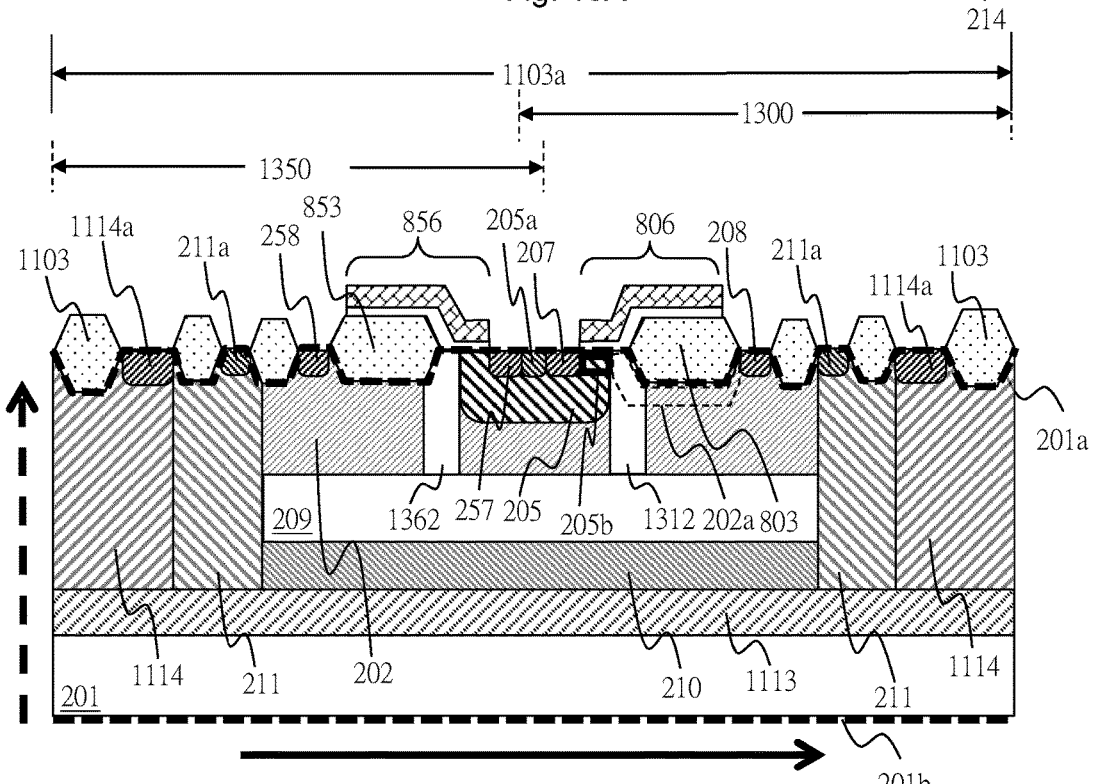

Please refer to FIGS. 13A and 13B for a twelfth embodiment according to the present invention. FIG. 13A shows a schematic diagram of a top view of high voltage devices 1300 and 1350. FIG. 13B is a cross-sectional view taken from the cross-section line MM' shown in FIG. 13A. As shown in FIGS. 13A and 13B, the isolation region 1103 is formed in the semiconductor substrate 201, to define the operation region 1103a. As shown in FIGS. 13A and 13B, two high voltage devices 1300 and 1350 are mirror arranged in the operation region 1103a which is defined by the isolation region 1103.

The high voltage well 202, the body region 205, the body contact 205a, the gate 806, the gate 856, the source 207, the source 257, the drain 208, the drain 258, the lateral lightly doped region 209, the first deep well 210, the first isolation well 211, the first isolation well contact 211a, the second deep well 1113, the second isolation well 1114, the second isolation well contact 1114a, a vertical lightly doped region 1312, and a vertical lightly doped region 1362 are formed in the semiconductor substrate 201. This embodiment is different from the tenth embodiment in that, in this embodiment, the high voltage devices 1300 and 1350 further include the vertical lightly doped regions 1312 and 1362 respectively. The vertical lightly doped region 1312 is located between and adjacent to the body region 205 and the high voltage well 202, and extends from the top surface 201a to the lateral lightly doped region 209 in the vertical direction. The vertical lightly doped region 1312 has the first conductivity type or the second conductivity type, and an impurity concentration of the vertical lightly doped region 1312 is for example lower than one tenth of the impurity concentration of the high voltage well 202. The vertical lightly doped region 1312 for example can be formed by: in the ion implantation process step for forming the high voltage well 202, masking a defined region of the vertical lightly doped region 1312 by a photo resist layer or a hard mask to block implantation into the defined region, to form the vertical lightly doped region 1312.

FIGS. 14A-14L show a thirteenth embodiment of the present invention. This embodiment shows an example of a manufacturing method of the high voltage devices 200 and 250 of the first embodiment according to the present invention from top views and cross-sectional views. For better understanding, top views and cross-section views of this embodiment are shown side by side in the figures.

Figure 14A:
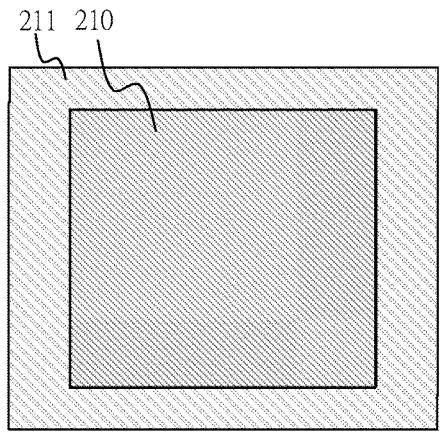
FIGS. 14A-14L show a thirteenth embodiment of the present invention.
Figure 14B:
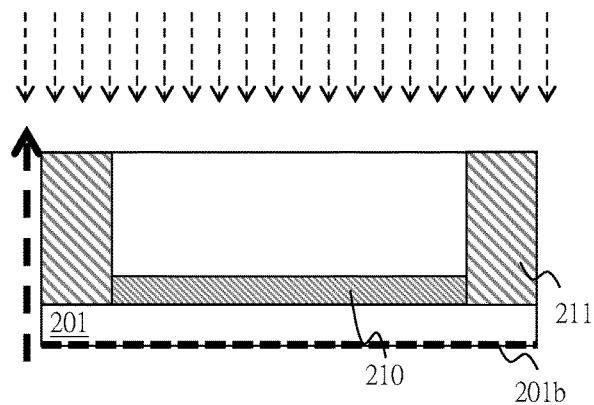

As shown in the top view FIG. 14A and the cross-sectional view FIG. 14B, a substrate 201 is provided, wherein the substrate 201 is for example but not limited to a P-type silicon substrate (or it can be another type of semiconductor substrate). The substrate 201 includes a top surface 201a (as indicated by a bold dashed polyline shown in FIG. 14F) and a bottom surface 201b opposite to the top surface 201a in the vertical direction (as shown by a bold dash arrow in FIG. 14B). Next, as shown in FIGS. 14A and 14B, the first deep well 210 is formed in the semiconductor substrate 201, which is located above the bottom surface 201b, and the first deep well 210 can be in contact with or not in contact with the bottom surface 201b in the vertical direction. The first deep well 201 can be formed by, for example but not limited to, a lithograph process step, an ion implantation process step (as indicated by thin dashed arrows shown in FIG. 14B), and a thermal process step, which are well known to those skilled in this art and therefore are not redundantly explained in detail here. Next, still referring to FIGS. 14A and 14B, the first isolation well 211 having the first conductivity type is formed at the periphery of the operation region 203a (which is to be defined later). The first isolation well 211 surrounds the operation region 203a; the first isolation well 211 extends from the top surface 201a to the first deep well 210 and is in contact with the first deep well 201.

Figure 14C:
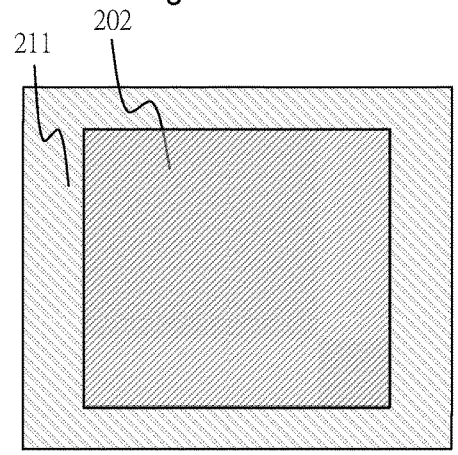
Figure 14D:
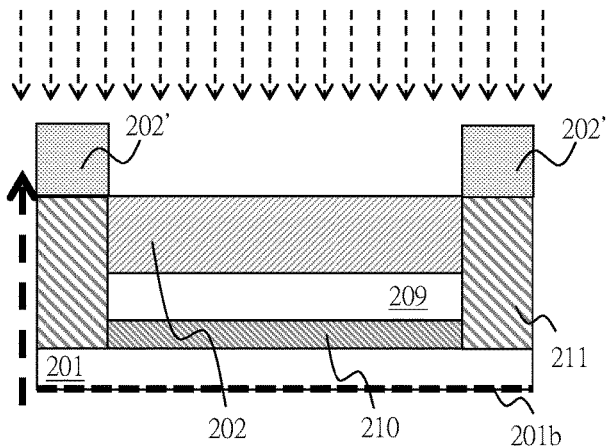

Next, as shown in the top view FIG. 14C and cross-sectional view FIG. 14D, the high voltage well 202 having the second conductivity type is formed in the semiconductor substrate 201, and is located beneath and in contact with the top surface 201a in the vertical direction. The high voltage well 202 overlays and is in contact with the lateral lightly doped region 209, wherein part of the high voltage well 202 serves as the drift region 202a. The high voltage well 202 can be formed by, for example but not limited to a lithograph process step, anion implantation process step (as indicated by thin dashed arrows shown in FIG. 14D) with a photo resist layer 202' as a mask, and a thermal process step, which are well known to those skilled in this art and therefore are not redundantly explained in detail here. The lateral lightly doped region 209 for example can be formed by: in the step of forming the high voltage well 202, controlling a depth of the high voltage well 202 such that the high voltage well 202 does not contact the first deep well 210 to forma vertical gap in between, and the lateral lightly doped region 209 is formed in this vertical gap between the high voltage well 202 and the first deep well 210. That is, in an ion implantation process step which forms the high voltage well 202, the process parameters such as an acceleration voltage is controlled, such that the implantation does not reach too deep to contact the first deep well 210, whereby the high voltage well 202 does not contact the first deep well 210, to form the lateral lightly doped region 209.

Figure 14E:
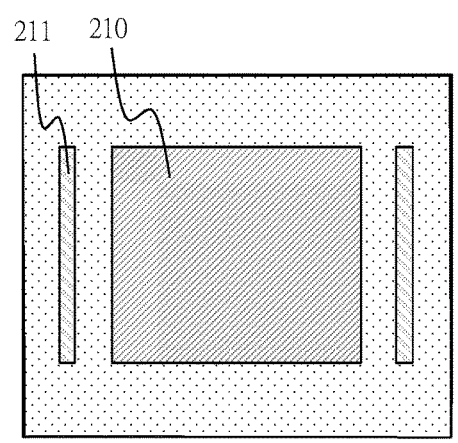
Figure 14F:
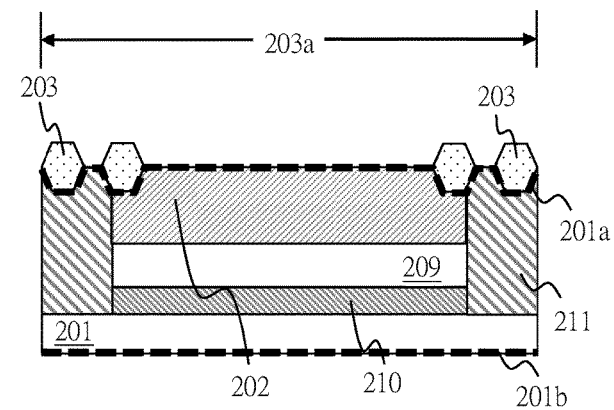

Next, as shown in the top view FIG. 14E and cross-sectional view FIG. 14F, the isolation region 203 is formed in the semiconductor substrate 201, to define the operation region 203a. The isolation region 203 is for example the shallow trench isolation (STI) structure, or the local oxidation of silicon (LOCOS) structure as shown in FIG. 14F.

Figure 14G:
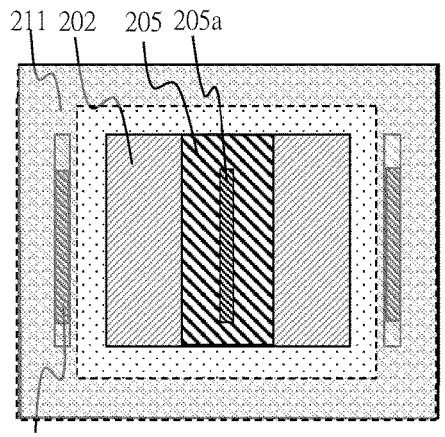
Figure 14H:
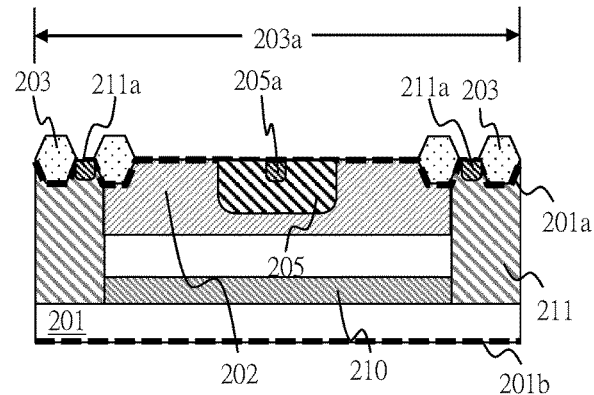

Next, as shown in the top view FIG. 14G and cross-sectional view FIG. 14H, the body region 205 and the body contact 205a are formed in the semiconductor substrate 201, wherein both the body region 205 and the body contact 205a have the first conductivity type, and are located in the operation region 203a, and are beneath and in contact with the top surface 201a in the vertical direction. Part of the body region serves as the switch channel region 205b. The high voltage well 202 surrounds the periphery and bottom of the body region 205. Next, the first isolation well contact 211a is formed as the electrical contact of the first isolation well 211.

Figure 14I:
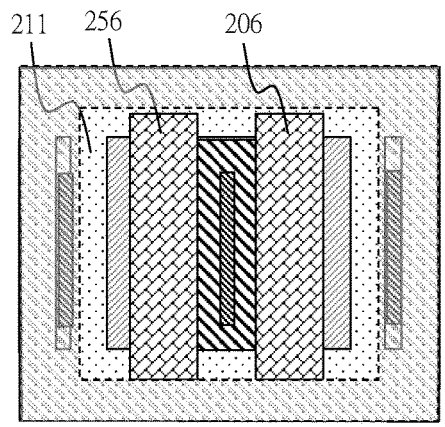
Figure 14J:
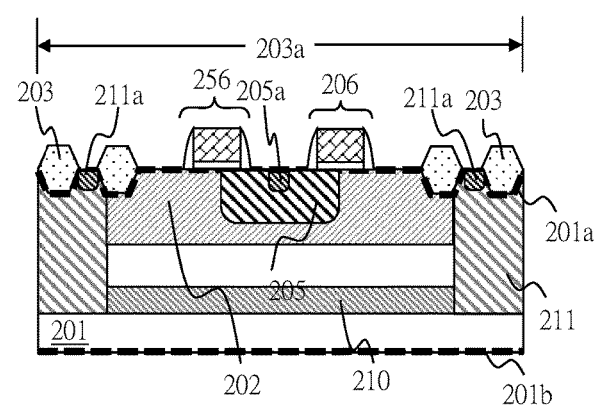

Next, as shown in the top view FIG. 14I and cross-sectional view FIG. 14J, the gates 206 and 256 are formed on the top surface 201a, wherein the gates 206 and 256 are stacked on and in contact with the top surface 201a. The gates 206 and 256 determine whether the high voltage devices 200 and 250 are conductive or not conductive respectively according to their respective gate voltages.

Figure 14K:
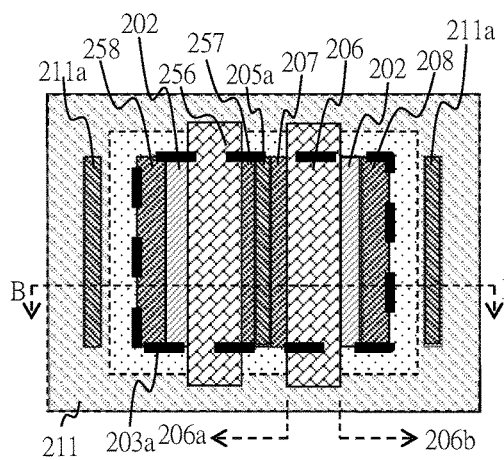
Figure 14L:
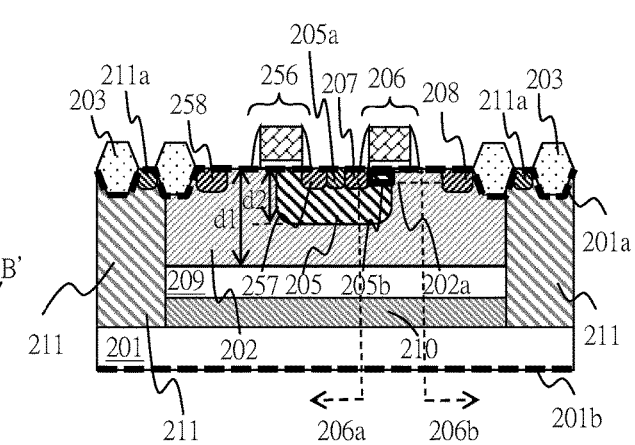

Next, as shown in the top view FIG. 14K and cross-sectional view FIG. 14L, the sources 207 and 257, and the drains 208 and 258 having the second conductivity type are formed for example by a lithography process step (including a self-alignment process step) which defines implantation regions, and an ion implantation process step which implants the second conductivity type impurities to the defined implantation regions in the form of accelerated ions. The source 207 and the drain 208 are located outside and below two sides of the gate 206 respectively. The source 207 is formed in the semiconductor substrate 201 and in the operation region 203a. The source 207 is stacked beneath and in contact with the top surface 201a in the vertical direction, wherein the body region 205 surrounds the periphery and the bottom of the source 207. The source 207 is located out of and below a first side 206a of the gate 206 and is adjacent to the gate 206 in the lateral direction.

The drain 208 having the second conductivity type is formed in the semiconductor substrate 201 and in the operation region 203a, and is located beneath and in contact with the top surface 201a, wherein the drain 208 is located outside and below the second side 206b of the gate 206, and is separated from the gate 206 by the drift region 202a in the lateral direction, wherein the length in the lateral direction of the drift region 202a is determined according to the operation voltage required for the high voltage device 200 to withstand in normal operation. Part of the body region 205 serves as a switch channel region 205b (as indicated by a bold solid frame shown in FIG. 14L). The body region 205, the gate 206, the source 207 and the drain 208 are all in the operation region 203a.

The present invention has been described in considerable detail having reference to certain preferred embodiments thereof. It should be understood that the description is for illustrative purpose, not for limiting the scope of the present invention. Those skilled in this art can readily conceive variations and modifications within the spirit of the present invention. For example, other process steps or structures which do not affect the primary characteristics of the device, such as a threshold voltage adjustment region, etc., can be added; for another example, the lithography step described in the above can be replaced by electron beam lithography, immersion lithography, or other lithography techniques. For another example, the conductivity types of the P-type and the N-type of all the embodiments are interchangeable, with corresponding modifications in the conductivity types and/ or impurity concentrations in corresponding regions. In view of the foregoing, the spirit of the present invention should cover all such and other modifications and variations, which should be interpreted to fall within the scope of the following claims and their equivalents. An embodiment or a claim of the present invention does not need to achieve all the objectives or advantages of the present invention. The title and abstract are provided for assisting searches but not for limiting the scope of the present invention.

What is claimed is:

1. A high voltage device, which is formed in a semiconductor substrate, wherein the semiconductor substrate has a top surface and a bottom surface opposite to the top surface in a vertical direction, the high voltage device comprising:
   a first deep well having a first conductivity type, which is formed in the semiconductor substrate;
   a lateral lightly doped region, which overlays and contacts the first deep well;
   a high voltage well having a second conductivity type, which is formed in the semiconductor substrate, and is located beneath and in contact with the top surface in the vertical direction, and the high voltage well overlays and is in contact with the lateral lightly doped region, wherein part of the high voltage well serves as a drift region;
   an isolation region, which is formed on the top surface to define an operation region;
   a body region having the first conductivity type, which is formed in the semiconductor substrate and in the operation region, and is located beneath the top surface and in contact with the top surface in the vertical direction, wherein part of the body region serves as a switch channel region, and the high voltage well surrounds a periphery and a bottom of the body region;
   a gate, which is formed on the top surface in the operation region, and is stacked on and in contact with the top surface in the vertical direction, wherein the gate determines whether the high voltage device is conductive or nonconductive according to a gate voltage;
a source having the second conductivity type, which is formed in the semiconductor substrate and in the operation region, and is stacked beneath and in contact with the top surface in the vertical direction, wherein the body region surrounds a periphery and a bottom of the source, wherein the source is located out of and below a first side of the gate and is adjacent to the gate in a lateral direction;
a drain having the second conductivity type, which is formed in the semiconductor substrate and in the operation region, and is located beneath and in contact with the top surface, wherein the drain is located out of and below a second side of the gate, and is separated from the gate by the drift region in a lateral direction; and
a first isolation well having the first conductivity type, which is located out of the operation region, and surrounds the operation region beneath the top surface, and extends from the top surface to the first deep well and is in contact with the first deep well;
wherein the body region, the gate, the source and the drain are all in the operation region.

2. The high voltage device of claim 1, further comprising:
a second deep well having the second conductivity type, which is formed in the semiconductor substrate, and is located beneath and in contact with the first deep well and the first isolation well; and
a second isolation well having the second conductivity type, which is located outside the first isolation well and surrounds the first isolation well beneath the top surface, the second isolation well extending from the top surface to the second deep well and being in contact with the second deep well.

3. The high voltage device of claim 1, wherein a bottom depth of the high voltage well is deeper than a bottom depth of the body region.

4. The high voltage device of claim 2, wherein a bottom depth of the high voltage well is deeper than a bottom depth of the body region.

5. The high voltage device of claim 1, wherein a bottom depth of the high voltage well is not deeper than a bottom depth of the body region.

6. The high voltage device of claim 2, wherein a bottom depth of the high voltage well is not deeper than a bottom depth of the body region.

7. The high voltage device of claim 1, further comprising a vertical lightly doped region, which is located between and adjacent to the body region and the high voltage well, and extends from the top surface to the lateral lightly doped region in the vertical direction.

8. The high voltage device of claim 2, further comprising a vertical lightly doped region, which is located between and adjacent to the body region and the high voltage well, and extends from the top surface to the lateral lightly doped region in the vertical direction.

9. The high voltage device of claim 1, further comprising a field oxide region, which is stacked on and in contact with the top surface, and at least part of the gate near the drain is stacked on and in contact with field oxide region.

10. The high voltage device of claim 2, further comprising a field oxide region, which is stacked on and in contact with the top surface, and at least part of the gate near the drain is stacked on and in contact with field oxide region.

11. The high voltage device of claim 9, wherein a bottom depth of the high voltage well is deeper than a bottom depth of the body region.

12. The high voltage device of claim 10, wherein a bottom depth of the high voltage well is deeper than a bottom depth of the body region.

13. The high voltage device of claim 9, wherein a bottom depth of the high voltage well is not deeper than a bottom depth of the body region.

14. The high voltage device of claim 10, wherein a bottom depth of the high voltage well is not deeper than a bottom depth of the body region.

15. The high voltage device of claim 9, further comprising a vertical lightly doped region, which is located between and adjacent to the body region and the high voltage well, and extends from the top surface to the lateral lightly doped region in the vertical direction.

16. The high voltage device of claim 10, further comprising a vertical lightly doped region, which is located between and adjacent to the body region and the high voltage well, and extends from the top surface to the lateral lightly doped region in the vertical direction.

17. The high voltage device of claim 1, wherein the lateral lightly doped region has the first conductivity type or the second conductivity type, and an impurity concentration of the lateral lightly doped region is lower than one tenth of an impurity concentration of the high voltage well.

18. The high voltage device of claim 2, wherein the lateral lightly doped region has the first conductivity type or the second conductivity type, and an impurity concentration of the lateral lightly doped region is lower than one tenth of an impurity concentration of the high voltage well.

19. A manufacturing method of a high voltage device, comprising:
providing a semiconductor substrate, which has a top surface and a bottom surface opposite to the top surface in a vertical direction;
forming a first deep well having a first conductivity type in the semiconductor substrate;
forming a lateral lightly doped region, which overlays and contacts the first deep well;
forming a high voltage well having a second conductivity type in the semiconductor substrate, the high voltage well being beneath and in contact with the top surface in the vertical direction, wherein the high voltage well overlays and is in contact with the lateral lightly doped region, wherein part of the high voltage well serves as a drift region;
forming an isolation region on the top surface to define an operation region;
forming a body region having the first conductivity type, which is formed in the semiconductor substrate and in the operation region, and is located beneath the top surface and in contact with the top surface in the vertical direction, wherein part of the body region serves as a switch channel region, and the high voltage well surrounds a periphery and a bottom of the body region;
forming a gate on the top surface in the operation region, wherein the gate is stacked on and in contact with the top surface in the vertical direction, wherein the gate determines whether the high voltage device is conductive or nonconductive according to a gate voltage;
forming a source having the second conductivity type in the semiconductor substrate and in the operation region, wherein the source is stacked beneath and in contact with the top surface in the vertical direction, wherein the body region surrounds a periphery and a bottom of the source, wherein the source is located out of and below a first side of the gate and is adjacent to the gate in a lateral direction;

forming a drain having the second conductivity type in the semiconductor substrate and in the operation region, wherein the drain is located beneath and in contact with the top surface, wherein the drain is located out of and below a second side of the gate, and is separated from the gate by the drift region in a lateral direction; and forming a first isolation well having the first conductivity type out of the operation region, wherein the first isolation well surrounds the operation region beneath the top surface, and wherein the first isolation well extends from the top surface to the first deep well and is in contact with the first deep well;

wherein the body region, the gate, the source and the drain are all in the operation region.

20. The manufacturing method of claim 19, further comprising:

forming a second deep well having the second conductivity type in the semiconductor substrate, wherein the second deep well is located beneath and in contact with the first deep well and the first isolation well; and forming a second isolation well having the second conductivity type outside the first isolation well, wherein the second isolation well surrounds the first isolation well beneath the top surface, and wherein the second isolation well extends from the top surface to the second deep well and is in contact with the second deep well.

21. The manufacturing method of claim 19, wherein a bottom depth of the high voltage well is deeper than a bottom depth of the body region.

22. The manufacturing method of claim 20, wherein a bottom depth of the high voltage well is deeper than a bottom depth of the body region.

23. The manufacturing method of claim 19, wherein a bottom depth of the high voltage well is not deeper than a bottom depth of the body region.

24. The manufacturing method of claim 20, wherein a bottom depth of the high voltage well is not deeper than a bottom depth of the body region.

25. The manufacturing method of claim 19, further comprising forming a vertical lightly doped region between and adjacent to the body region and the high voltage well, wherein the vertical lightly doped region extends from the top surface to the lateral lightly doped region in the vertical direction.

26. The manufacturing method of claim 20, further comprising forming a vertical lightly doped region between and adjacent to the body region and the high voltage well, wherein the vertical lightly doped region extends from the top surface to the lateral lightly doped region in the vertical direction.

27. The manufacturing method of claim 19, further comprising forming a field oxide region, which is stacked on and in contact with the top surface, and at least part of the gate near the drain is stacked on and in contact with field oxide region.

28. The manufacturing method of claim 20, further comprising forming a field oxide region, which is stacked on and in contact with the top surface, and at least part of the gate near the drain is stacked on and in contact with field oxide region.

29. The manufacturing method of claim 27, wherein a bottom depth of the high voltage well is deeper than a bottom depth of the body region.

30. The manufacturing method of claim 28, wherein a bottom depth of the high voltage well is deeper than a bottom depth of the body region.

31. The manufacturing method of claim 27, wherein a bottom depth of the high voltage well is not deeper than a bottom depth of the body region.

32. The manufacturing method of claim 28, wherein a bottom depth of the high voltage well is not deeper than a bottom depth of the body region.

33. The manufacturing method of claim 27, further comprising forming a vertical lightly doped region between and adjacent to the body region and the high voltage well, wherein the vertical lightly doped region extends from the top surface to the lateral lightly doped region in the vertical direction.

34. The manufacturing method of claim 28, further comprising forming a vertical lightly doped region between and adjacent to the body region and the high voltage well, wherein the vertical lightly doped region extends from the top surface to the lateral lightly doped region in the vertical direction.

35. The manufacturing method of claim 19, wherein the step of forming the lateral lightly doped region includes: in the step of forming the high voltage well, controlling a depth of the high voltage well such that the high voltage well does not contact the first deep well, wherein the lateral lightly doped region is formed in a vertical gap between the high voltage well and the first deep well.

36. The manufacturing method of claim 20, wherein the step of forming the lateral lightly doped region includes: in the step of forming the high voltage well, controlling a depth of the high voltage well such that the high voltage well does not contact the first deep well, wherein the lateral lightly doped region is formed in a vertical gap between the high voltage well and the first deep well.

* * * * *